United States Patent
Ler et al.

(10) Patent No.: US 12,243,810 B2
(45) Date of Patent: Mar. 4, 2025

(54) SEMICONDUCTOR PACKAGE WITH WETTABLE FLANK AND RELATED METHODS

(71) Applicant: SEMICONDUCTOR COMPONENTS INDUSTRIES, LLC, Phoenix, AZ (US)

(72) Inventors: Hui Min Ler, Seremban (MY); Soon Wei Wang, Seremban (MY); Chee Hiong Chew, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 157 days.

(21) Appl. No.: 18/056,100

(22) Filed: Nov. 16, 2022

(65) Prior Publication Data
US 2023/0073773 A1 Mar. 9, 2023

Related U.S. Application Data

(62) Division of application No. 17/136,136, filed on Dec. 29, 2020, now Pat. No. 11,532,539.

(51) Int. Cl.
| | |
|---|---|
| *H01L 23/495* | (2006.01) |
| *H01L 21/48* | (2006.01) |
| *H01L 21/56* | (2006.01) |
| *H01L 21/78* | (2006.01) |
| *H01L 23/31* | (2006.01) |

(52) U.S. Cl.
CPC .... *H01L 23/49541* (2013.01); *H01L 21/4825* (2013.01); *H01L 21/4828* (2013.01); *H01L 21/565* (2013.01); *H01L 21/78* (2013.01); *H01L 23/3107* (2013.01); *H01L 23/49503* (2013.01); *H01L 23/49524* (2013.01); *H01L 23/49575* (2013.01)

(58) Field of Classification Search
CPC .......... H01L 23/49541; H01L 21/4825; H01L 21/4828; H01L 21/565; H01L 21/78; H01L 23/3107; H01L 23/49503; H01L 23/49524; H01L 23/49575
USPC ....................................................... 257/670
See application file for complete search history.

(56) References Cited

U.S. PATENT DOCUMENTS

| | | |
|---|---|---|
| 6,400,004 B1 | 6/2002 | Fan et al. |
| 6,593,643 B1 | 7/2003 | Seki et al. |

(Continued)

*Primary Examiner* — Caleb E Henry
*Assistant Examiner* — Dilinh P Nguyen
(74) *Attorney, Agent, or Firm* — IPTechLaw

(57) ABSTRACT

Implementations of the semiconductor package may include a first sidewall opposite a second sidewall, and a third sidewall opposite a fourth sidewall. Implementations of the semiconductor package may include a first lead and a second lead extending from the first sidewall and a first half-etched tie bar directly coupled to the first lead. An end of the first half-etched tie bar may be exposed on the third sidewall of the semiconductor package. Implementations of the semiconductor package may also include a second half-etched tie bar directly coupled to the second lead. An end of the second half-etched tie bar may be exposed on the fourth sidewall. An end of the first lead and an end of the second lead may each be electroplated. The first die flag and the second die flag may be electrically isolated from the first lead and the second lead.

20 Claims, 14 Drawing Sheets

(56) References Cited

U.S. PATENT DOCUMENTS

| | | | |
|---|---|---|---|
| 7,169,651 B2 * | 1/2007 | Park | H01L 24/97 |
| | | | 438/464 |
| 7,786,557 B2 | 8/2010 | Hsieh et al. | |
| 8,089,145 B1 | 1/2012 | Kim et al. | |
| 8,912,635 B2 * | 12/2014 | Tan | H01L 21/561 |
| | | | 257/676 |
| 10,304,798 B2 | 5/2019 | Celaya et al. | |
| 2001/0019854 A1 * | 9/2001 | Lin | H01L 23/3107 |
| | | | 257/E23.054 |
| 2008/0258273 A1 | 10/2008 | Liang et al. | |
| 2009/0194854 A1 | 8/2009 | Tan et al. | |
| 2018/0090421 A1 | 3/2018 | Then et al. | |

\* cited by examiner

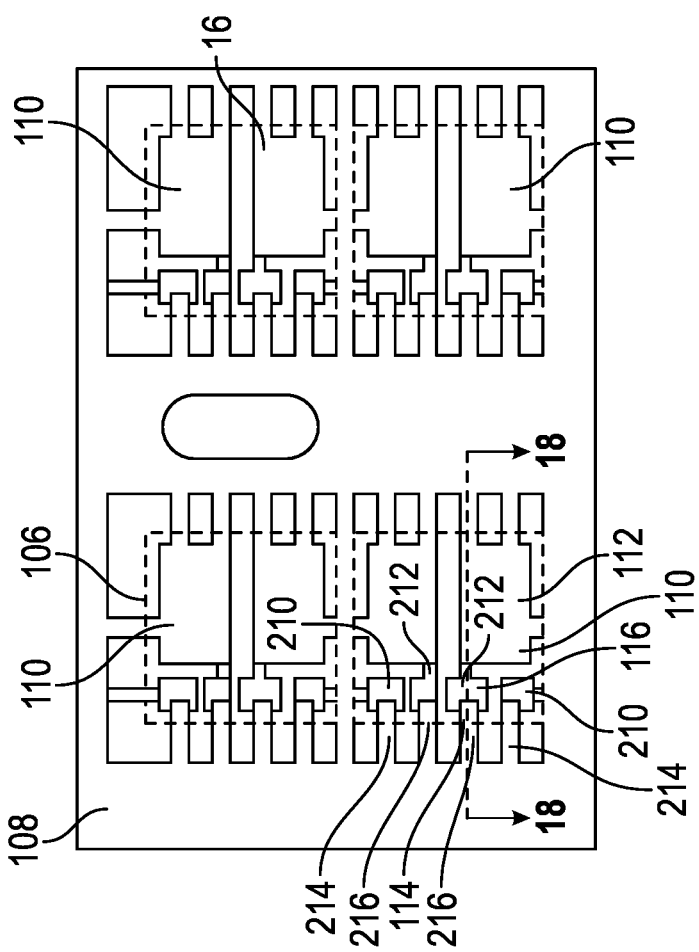
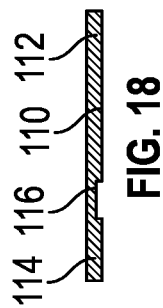

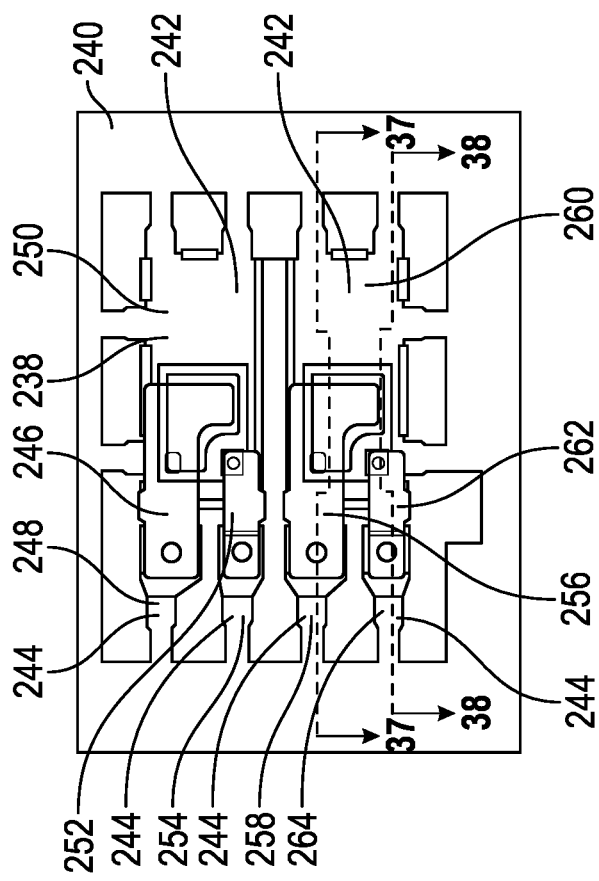
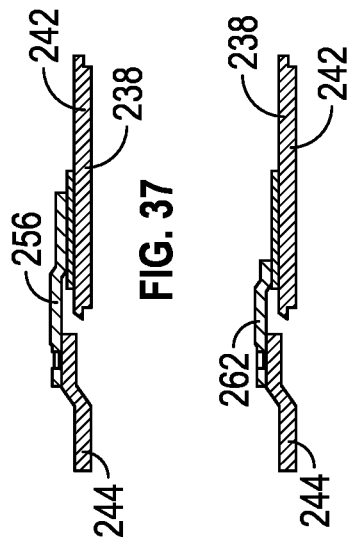
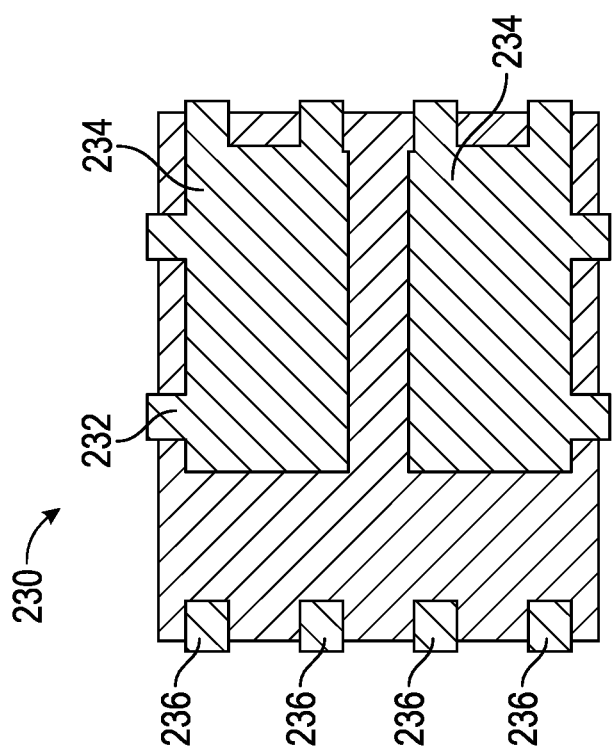
FIG. 36
FIG. 37
FIG. 38
FIG. 35

SEMICONDUCTOR PACKAGE WITH WETTABLE FLANK AND RELATED METHODS

CROSS REFERENCE TO RELATED APPLICATIONS

This application is a divisional application of the earlier U.S. Utility patent application to Hui Min Ler entitled "Semiconductor Package with Wettable Flank," application Ser. No. 17/136,136, filed Dec. 29, 2020, the disclosure of which is hereby incorporated entirely herein by reference.

BACKGROUND

1. Technical Field

Aspects of this document relate generally to semiconductor packages. More specific implementations involve flat no-leads semiconductor packages.

2. Background

Semiconductor packages contain electrical components that perform various functions. The semiconductor packages may be encapsulated in a mold compound. Semiconductor packages may include electrical terminals electrically coupling internal of electrical components to external electrical devices.

SUMMARY

Implementations of the semiconductor package may include a first surface opposite a second surface, a first sidewall opposite a second sidewall, and a third sidewall opposite a fourth sidewall. The first sidewall, second sidewall, third sidewall, and fourth sidewall may be coupled between the first surface and the second surface. Implementations of the semiconductor package may include a first lead and a second lead extending from the first sidewall and a first half-etched tie bar directly coupled to the first lead. An end of the first half-etched tie bar may be exposed on the third sidewall of the semiconductor package. Implementations of the semiconductor package may also include a second half-etched tie bar directly coupled to the second lead. An end of the second half-etched tie bar may be exposed on the fourth sidewall. Implementations of the semiconductor package may include a first die flag, a second die flag, and a mold compound at least partially encapsulating the first lead, the second lead, the first tie bar, the second tie bar, the first die flag, and the second die flag. An end of the first lead and an end of the second lead may each be electroplated. The first die flag and the second die flag may be electrically isolated from the first lead and the second lead.

Implementations of semiconductor packages may include one, all, or any of the following:

The mold compound may be between the first surface and the first half-etched tie bar, the first surface and the second half-etched tie bar, the second surface and the first half-etched tie bar, and the second surface and the second half-etched tie bar.

Implementations of the semiconductor package may include a third lead and a fourth lead extending from the first sidewall.

Implementations of the semiconductor package may include a third half-etched tie bar directly coupled to the third lead and a fourth half-etched tie bar directly coupled to the fourth lead. An end of the third half-etched tie bar may be exposed on the third side of the semiconductor package and an end of the fourth half-etched tie bar may be exposed on the fourth side of the semiconductor package.

Implementations of the semiconductor package may include a trench extending into the first surface. The trench may separate the first lead, the second lead, the third lead, and the fourth lead from the first die flag and the second die flag.

The first half-etched tie bar and the second half-etched tie bar may be used to electroplate the first lead and the second lead.

An end of the third half-etched tie bar and an end of the fourth half-etched tie bar may be exposed on a sidewall of the trench.

Each electroplated end of the first lead and the second lead may extend from the first sidewall at least eight micrometers ($\mu m$).

Implementations of a method of forming a semiconductor package may include providing a lead frame encompassed by an outer frame. The lead frame may include a plurality of leads, a plurality of die flags, and a plurality of tie bars directly coupled between the plurality of leads and the outer frame. Implementations of the method of forming the semiconductor package may also include half-etching the plurality of tie bars, at least partially encapsulating the lead frame in a mold compound, exposing an end of each lead of the plurality of leads through removing a first side of the outer frame from the lead frame, removing a second side of the outer frame opposite the first side of the outer frame, electroplating an end of each lead of the plurality of leads through a plurality of half-etched tie bars, singulating the lead frame from the outer frame through removal of a third side of the outer frame and an opposing fourth side of the outer frame, and exposing an end of each tie bar of the plurality of tie bars through the removal of the third side and the fourth side of the outer frame.

Implementations of methods of forming a semiconductor packages may include one, all, or any of the following:

The plurality of tie bars may include four tie bars.

The plurality of tie bars may include two tie bars.

Implementations of the method of forming a semiconductor package may include half-etching a second plurality of tie bars directly coupled to and between the second plurality of leads and the plurality of die flags.

Implementations of the method of forming a semiconductor package may include exposing an end of each lead of the second plurality of leads through removing the first side of the outer frame.

Implementations of the method of forming a semiconductor package may include electroplating the end of each lead of the second plurality of the leads through the second plurality of tie bars.

Implementations of the method of forming a semiconductor package may include electrically isolating the plurality of die flags from the plurality of second leads by forming a trench through the second plurality of tie bars.

Implementations of the method of forming a semiconductor package may include providing a lead frame having a plurality of leads and a plurality of die flags. The lead frame may be encompassed by an outer frame. Implementations of the method of forming the semiconductor package may include electrically coupling the plurality of leads to the plurality of die flags through a plurality of clips, at least partially encapsulating the lead frame and plurality of clips in a mold compound, exposing an end of each lead of the plurality of leads through removing a first side of the outer frame for the lead frame, electroplating the end of each lead through the plurality of clips, and removing the remaining outer frame from the lead frame.

Implementations of the method of forming a semiconductor package may include one, all, or any of the following:

The plurality of die flags may include two die flags.

The plurality of clips may include two gate clips and two source clips.

Each end of each lead may include a thickness of at least eight μm of electroplated material coupled thereto.

Removing the first side of the outer frame may be done through a first punch process and removing the remaining outer frame may be done through a second punch process.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 16 is an illustration of a bottom view of another implementation of a semiconductor package;

FIG. 17 is an illustration of a top view of a plurality of the lead frames coupled to an outer frame;

FIG. 18 is a cross-sectional view of a lead frame of FIG. 17;

FIG. 35 is an illustration of a bottom view of another implementation of a semiconductor package;

FIG. 36 is an illustration of a top view of a lead frame coupled to an outer frame;

FIG. 37 is an illustration of a cross-sectional view of a first portion of the lead frame of FIG. 36;

FIG. 38 is an illustration of a cross sectional view of a second portion of the lead frame of FIG. 36;

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
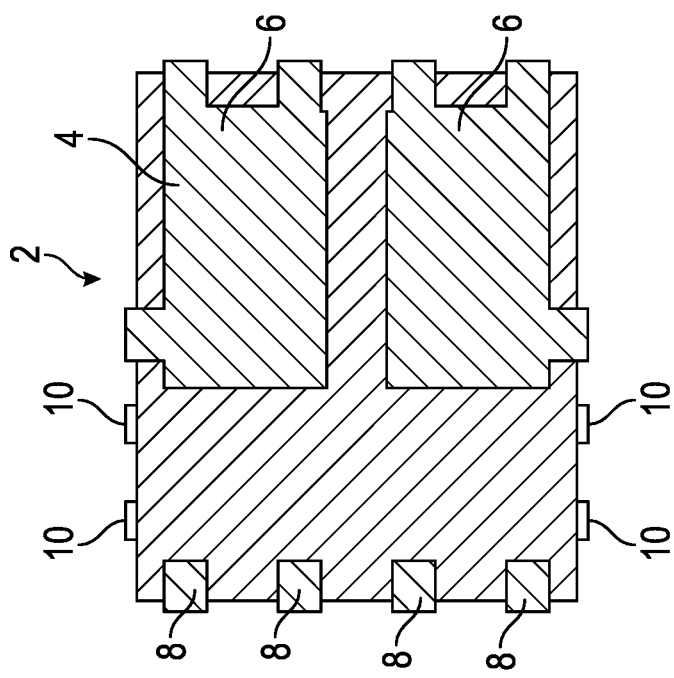
FIG. 1 is an illustration of a bottom view of an implementation of a semiconductor package.

Referring to FIG. 1, a bottom view of an implementation of a semiconductor package is illustrated. The semiconductor package 2 includes a lead frame 4. In various implementations, the lead frame 4 may include one or more die flags 6, a plurality of leads 8, and one or more tie bars 10. In particular implementations, including any implementation disclosed herein, the semiconductor package may be a dual die flat lead package. In other implementations, the semiconductor package may be a type of package different from a dual die flat lead package. While particular designs of the lead frames are disclosed herein, it is understood that the techniques disclosed herein are not limited to application in lead frames having a design similar or identical to that described herein and illustrated by the figures.

Figure 2:
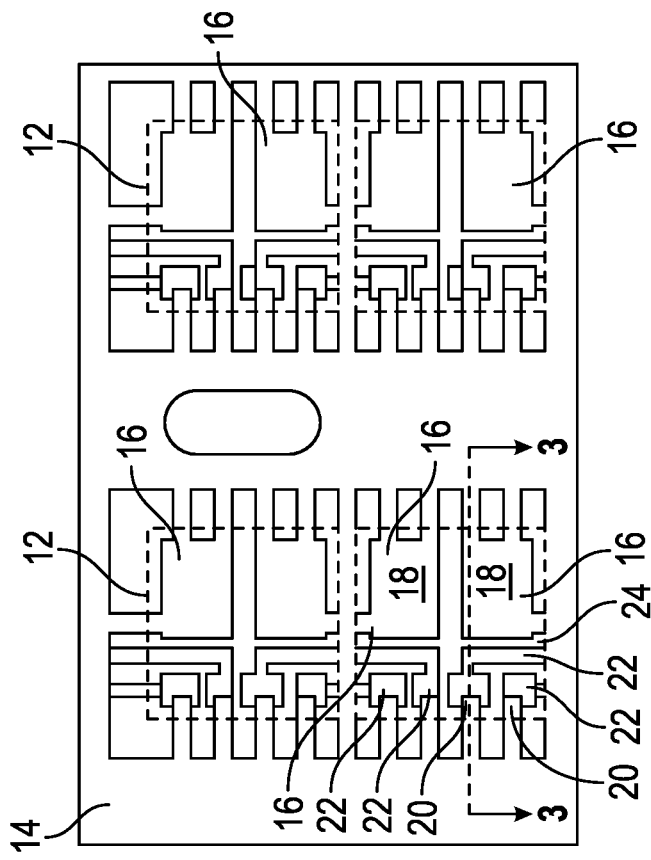
FIG. 2 is an illustration of a top view of a plurality of the lead frames coupled to an outer frame.

Referring to FIG. 2, a top view of a plurality of the lead frames coupled to an outer frame is illustrated. The lead frames illustrated in FIG. 2 may be the same as or similar to the lead frame of the semiconductor package of FIG. 1. As indicated by the dashed lead perimeter lines 12 of FIG. 2, in various implementations an outer frame 14 may be coupled to a plurality of lead frames 16. While FIG. 2 illustrates the outer frame as having four lead frames, the outer frame 14 may be coupled to more than four lead frames. In particular implementations the outer frame may be coupled to 448 lead frames.

Figure 3:
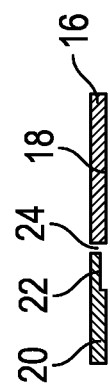
FIG. 3 is an illustration of a cross-sectional view of a lead frame of FIG. 2.

Referring to FIG. 3, a cross-sectional side view of a lead frame of FIG. 2 is illustrated. The cross-sectional view of FIG. 3 is taken across line 3-3 of FIG. 2. As illustrated by FIGS. 2 and 3, each lead frame includes one or more die flags 18. In various implementations, and as illustrated by FIGS. 2 and 3, each lead frame includes a plurality of leads 20. In various implementations, the lead frame may include a tie bar directly coupled to each lead of the plurality of leads 20. As illustrated by FIG. 3, the tie bars 22 may be half-etched. As illustrated by FIGS. 2 and 3, in various implementations the one or more die flags 18 may be electrically isolated from the plurality of leads 20 and the plurality of tie bars by a gap 24.

Figure 5:
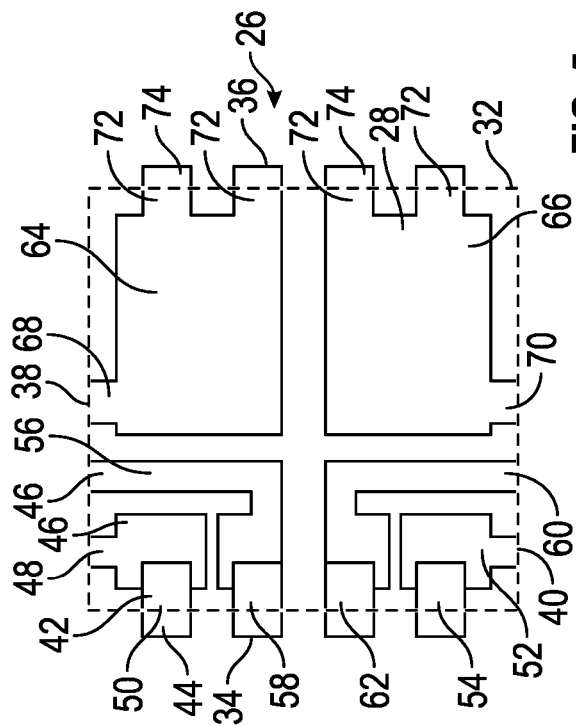
FIG. 5 is an illustration of a bottom view of the lead frame of FIG. 4.
Figure 7:
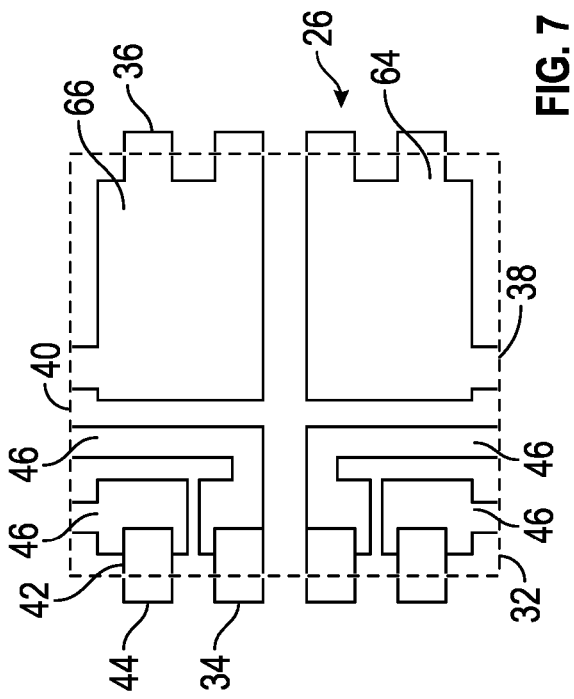
FIG. 7 is an illustration of a top view of the lead frame of FIG. 4.
Figure 4:
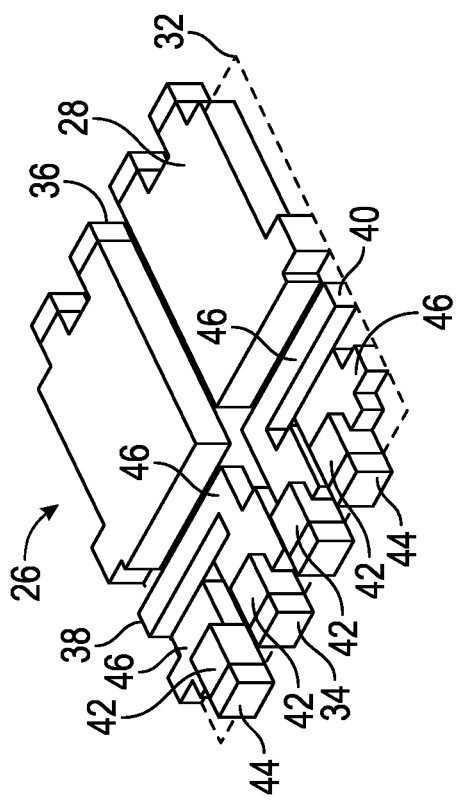
FIG. 4 is an illustration of a bottom perspective view of an implementation of a lead frame.
Figure 6:
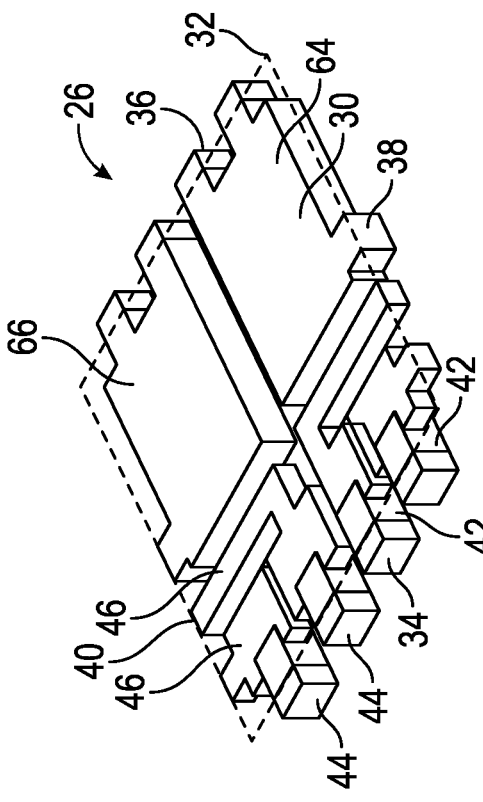
FIG. 6 is an illustration of a top perspective view of the lead frame of FIG. 4.

Referring to FIG. 4, a bottom perspective view of an implementation of a lead frame is illustrated. Referring to FIG. 5, a bottom view of the lead frame of FIG. 4 is illustrated. The lead frame of FIGS. 4-15 may be the same as or similar to the lead frames illustrated in any of FIGS. 1-3. As used herein, "bottom" refers to the side of the lead frame and or semiconductor package that is configured to be placed on an external electric device. In various implementations, the lead frame 26 may be made from copper, aluminum, any other metal, any other conductive material, or any combination thereof. As illustrated by FIGS. 4 and 5, the lead frame 26 includes a first surface 28. Referring to FIG. 6, a top perspective view of the lead frame of FIG. 4 is illustrated. Referring to FIG. 7, a top view of the lead frame of FIG. 4 is illustrated. As illustrated by FIGS. 6 and 7, the lead frame 26 includes a second surface 30 opposite the first surface 28.

As illustrated by FIGS. 4-15, the dashed perimeter line 32 is included to illustrate the plane that the second surface 30 lies in as well as showing the perimeter of the lead frame encompassed within the mold compound. As illustrated by FIGS. 4-7, the lead frame includes a first side 34, a second side 36, a third side 38, and a fourth side 40. The first side 34 is opposite the second side 36 and the third side 38 is opposite the fourth side 40. In various implementations, the first side 34 of the lead frame includes a plurality of leads 42. In various implementations, the plurality of the leads 42 may include four leads. In other implementations, the plurality of leads may include two leads. In still other implementations, the plurality of the leads 42 may include any other number of leads. In various implementations, each lead of the plurality of leads 42 may include an electroplated end 44. The electroplated end may be tin, copper, or any other type of metallic or conductive material.

Still referring to FIGS. 4-7, the lead frame includes a plurality of half-etched tie bars 46. In various implantations, the number of tie bars within the plurality of tie bars 46 may be the same as the number of leads within the plurality of leads 42. In other implementations, the lead frame may include more or fewer tie bars than there are leads within the plurality of leads on the first side of the lead frame. In particular implementations, and as illustrated by FIG. 5, the lead frame may include a first tie bar 48 directly coupled to a first lead 50, a second tie bar 52 directly coupled to a second lead 54, a third tie bar 56 directly coupled to a third lead 58, and a fourth tie bar 60 directly coupled to a fourth lead 62. As illustrated by FIGS. 4 and 6, the half-etch of the plurality of tie bars 46 may be considered a bottom half-etch inasmuch as the bottom surface (or the surface facing the bottom of the semiconductor package) of the tie bars are etched. In various implementations, the tie bars may be used to electroplate the ends of the plurality of tie bars. In particular implementations, the first tie bar 48 may be used to electroplate an end of the first lead 50, the second tie bar 52 may be used to electroplate an end of the second lead 54, the third tie bar 56 may be used to electroplate an end of the third lead 58, and the fourth tie bar 60 may be used to electroplate an end of the fourth lead 62.

Referring to FIG. 5, in various implementations the first tie bar 48 may be positioned between the first lead 50 and a portion of the third tie bar 56. The third tie bar 56 may be between the first tie bar 48 and the first die flag 64. Likewise, the second tie bar 52 may be positioned between the second lead 54 and the fourth tie bar 60. The fourth tie bar 60 may also be positioned between the second tie bar 52 and a second die flag 66. The third tie bar 56 may also be between the third lead 58 and the first die flag 64. Similarly, the fourth tie bar 60 may also be between the fourth lead 62 and the second die flag 66. In such implementations, the third tie bar 56 and the fourth tie bar 60 may each include a 90° turn therein.

Still referring to FIGS. 4-7, the lead frame may include a first die flag 64 and a second die flag 66. In other implementations, the lead frame may include only a single die flag or may include more than two die flags. Any of the die flags of the lead frame 26 (or any other die flag of any other implementation disclosed herein) may also serve as a heat sink. As illustrated clearly in FIGS. 5 and 7, in various implementations the die flags may be electrically isolated from the plurality of tie bars 46. In particular implementations, and as illustrated, all of the tie bars may be electrically isolated from the die flags. In other implementations, such as the implementation disclosed by FIGS. 19-34, only a portion of the tie bars of the plurality of tie bars 46 may be electrically isolated from the die flags.

In various implementations, the first die flag 64 may include a first die flag tie bar 68. Similarly, in various implementations, the second die flag 66 may include a second die flag tie bar 70. The die flag tie bars may be on the same sides of the lead frame as the plurality of tie bars 46.

In various implementations, the first die flag 64 and the second die flag 66 may include one or more die flag leads 72 directly coupled to the first die flag 64 and or the second die flag 66. The die flag leads may be on the second side 36 of the lead frame opposite the first side 34 of the lead frame. In various implementations, each of the die flag leads 72 may include an electroplated end 74. The electroplated end 74 may be the same as or similar to any other electroplated end disclosed herein.

Figure 9:
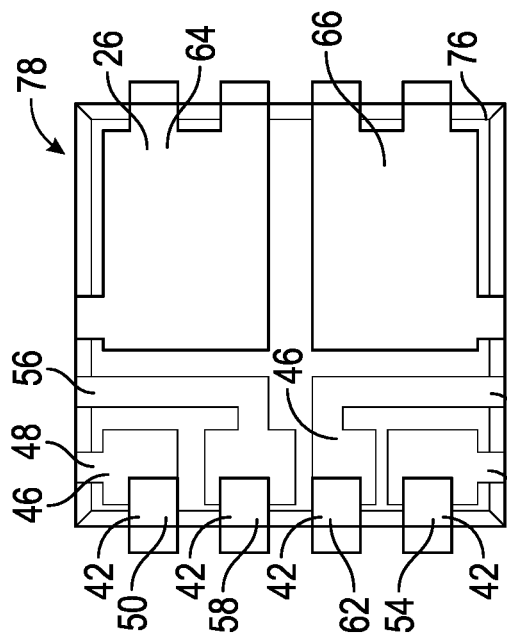
FIG. 9 is an illustration of a bottom view of the lead frame and mold compound of FIG. 8.
Figure 11:
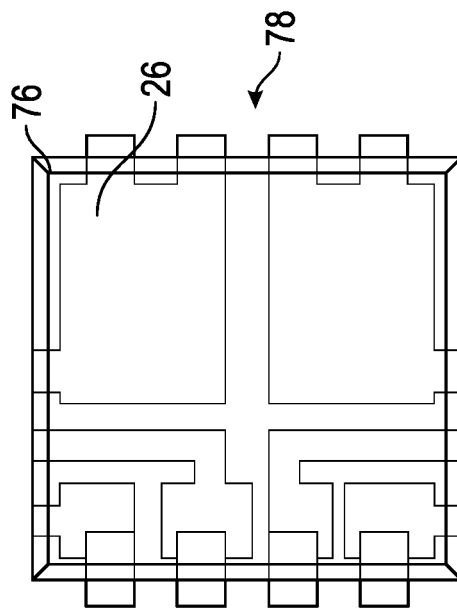
FIG. 11 is an illustration of a top view of the lead frame and mold compound of FIG. 8.
Figure 8:
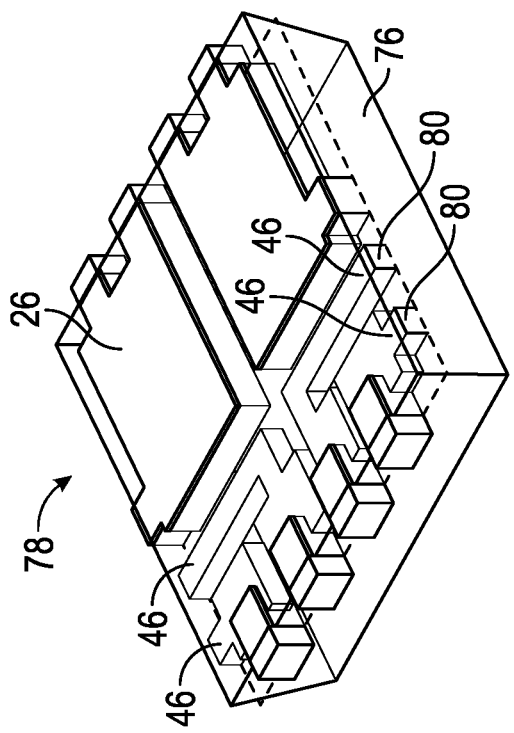
FIG. 8 is an illustration of a bottom perspective view of the lead frame of FIG. 4 encapsulated by a mold compound illustrated as transparent.
Figure 10:
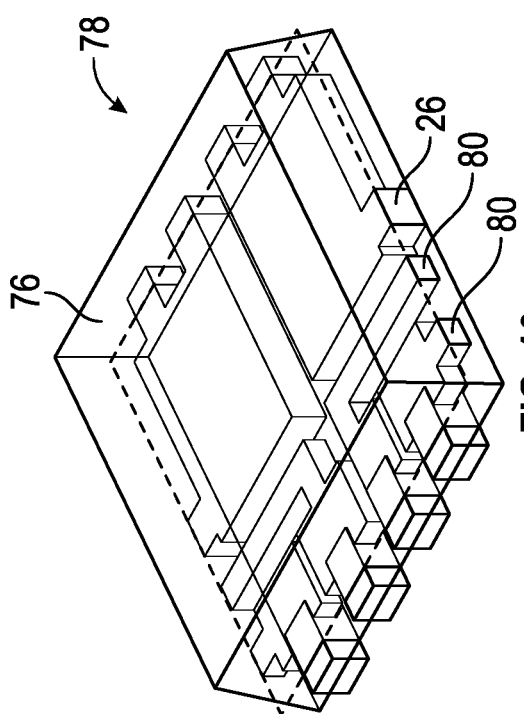
FIG. 10 is an illustration of a top perspective view of the lead frame and mold compound of FIG. 8.

Referring to FIGS. 8 through 11, implementations of the lead frame of FIGS. 4-7 encapsulated by a mold compound are illustrated. The mold compound 76 is illustrated as transparent in order to fully understand the relation between the mold compound 76 and the lead frame 26 in the semiconductor package 78. More specifically, referring to FIG. 8, a bottom perspective view of the lead frame of FIG. 4 encapsulated by a mold compound is illustrated. Referring to FIG. 9, a bottom view of the lead frame and mold compound of FIG. 8 is illustrated. Referring to FIG. 10, a top perspective view of the lead frame and mold compound of FIG. 8 is illustrated. Referring to FIG. 11, a top view of the lead frame and mold compound of FIG. 8 is illustrated.

As illustrated by at least FIGS. 8 and 10, each of the plurality of tie bars 46 are entirely encapsulated within the mold compound 76 except for a single end 80 of each tie bar of the plurality of tie bars 46. In various implementations, and as clearly illustrated by FIGS. 9 and 11, mold compound 76 may electrically isolate the first tie bar 48 from the third tie bar 56, the second tie bar 52 from fourth tie bar 60, the third tie bar 56 from the fourth tie bar 60, and/or the plurality of tie bars 46 from the first die flag 64 and the second die flag 66. In turn, the first die flag 64 and the second die flag 66 may be electrically isolated from the plurality of leads 42.

Figure 12:
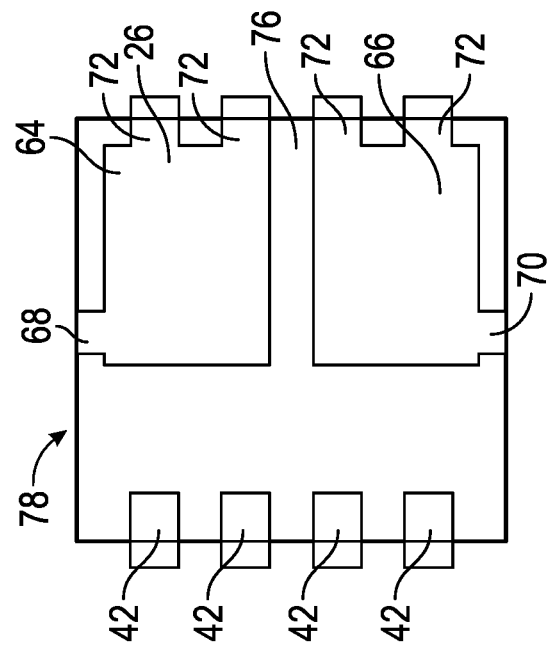
FIG. 12 is an illustration of a bottom perspective view of a semiconductor package.
Figure 13:
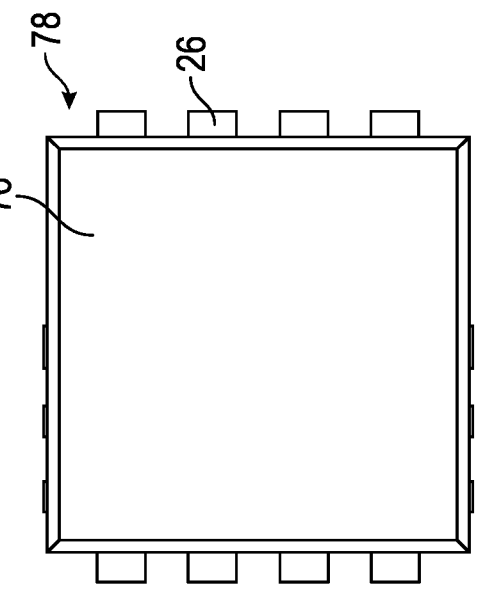
FIG. 13 is an illustration of a bottom view of the semiconductor package of FIG. 12.
Figure 14:
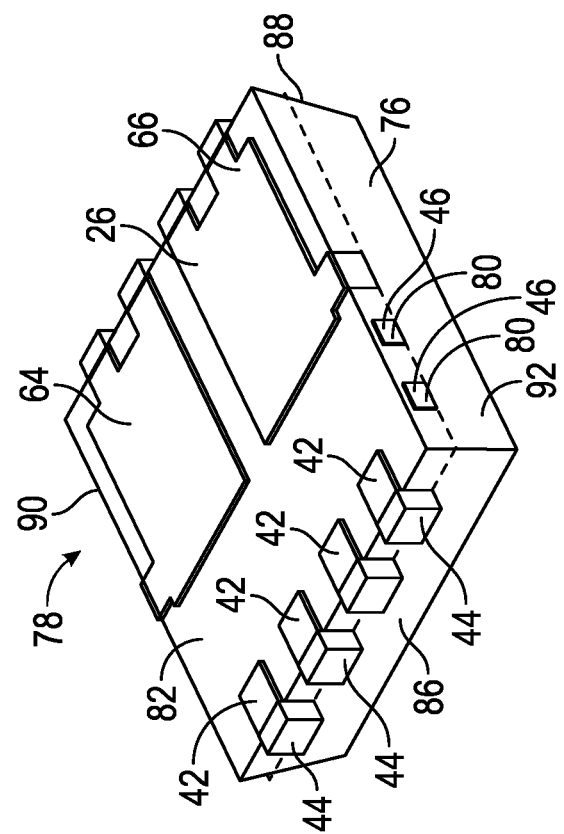
FIG. 14 is an illustration of a top perspective view of the semiconductor package of FIG. 12.
Figure 15:
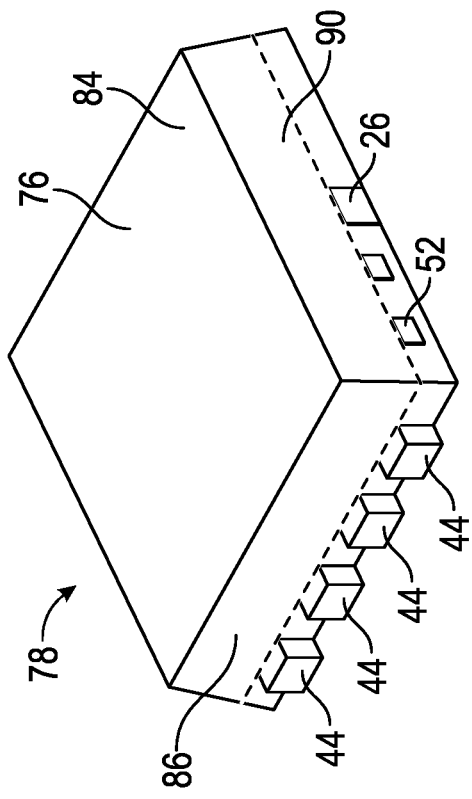
FIG. 15 is an illustration of a top view of the semiconductor package of FIG. 12.

Referring to FIGS. 12-15, the lead frame and mold compound of FIGS. 8-11 are illustrated with the mold compound illustrated as opaque. More specifically, referring to FIG. 12, a bottom perspective view of a semiconductor package is illustrated. Referring to FIG. 13, a bottom view of the semiconductor package of FIG. 12 is illustrated. Referring to FIG. 14, a top perspective view of the semiconductor package of FIG. 12 is illustrated. Referring to FIG. 15, a top view of the semiconductor package of FIG. 12 is illustrated. As illustrated by FIGS. 12 through 15, the semiconductor package includes a first surface 82 opposite a second surface 84. In various implementations, the first surface 82 of the semiconductor package 78 corresponds to the first surface of the lead frame 26 and the second surface 84 of the semiconductor package corresponds to the second surface of the lead frame. Further, as illustrated by FIGS. 12 through 15, the semiconductor package 78 includes a first sidewall 86, a second sidewall 88 opposite the first sidewall, a third sidewall 90, and a fourth sidewall 92 opposite the third sidewall. The third sidewall 90 and the fourth sidewall 92 are coupled between the first sidewall 86 and the second sidewall 88. Each of the sidewalls are also coupled between the first surface 82 the second surface 84. In various implementations, and as illustrated by FIGS. 12-15, any or all the first sidewall 86, the second sidewall 88, the third sidewall 90, and/or the fourth sidewall 92 may be sloped. In other implementations, any of the first sidewall 86, the second sidewall 88, the third sidewall 90, and/or the fourth sidewall 92 may be perpendicular to both the first surface 82 and the second surface 84 of the semiconductor package 78.

In various implementations, a plurality of leads 42 may extend from the first sidewall 86 of the semiconductor package 78. In various implementations, the electroplated ends 44 of the plurality of leads 42 may be the portion of the leads that extend from the first sidewall 86. In particular implementations, each lead, which may include the electroplated end, may extend from the first sidewall 86 eight μm.

In other implementations, each lead of the plurality of leads 42 may extend from the first sidewall of the semiconductor package more than or less than 8 μm.

Any of the electroplated ends disclosed herein may be considered wettable flanks. In various implementations, the flanks, or the exposed ends of the leads, may protrude from the sidewall of the package due to the additional electroplated material forming the end of the lead. The additional electroplated material may promote solder wetting when the semiconductor package is soldered to an external device.

Referring to FIGS. 12 and 14, an end 80 of each of the plurality of tie bars 46 is exposed on either the third sidewall 90 or the fourth sidewall 92 of the semiconductor package 78. More particularly, and as also illustrated by FIGS. 9 and 11, in various implementations, an end of the first tie bar 48 may be exposed on the third sidewall 90, an end of the second tie bar 52 may be exposed on the fourth sidewall 92, an end of the third tie bar 56 may be exposed on the third sidewall, and an end of the fourth tie bar 60 may be exposed on the fourth sidewall. As illustrated, the ends 80 of the tie bars 46 are the only portion of the tie bars exposed through the mold compound 76 of the semiconductor package 78 inasmuch as the mold compound is between the first surface 82 of the semiconductor package and the plurality of half-etched tie bars 46 and is also between the second surface 84 the semiconductor package and the plurality of half-etched tie bars 46. In various supplementations, the ends of the tie bars 46 may be flush or substantially flush with the third sidewall 90 and or the fourth sidewall 92. In implementations where the ends of the tie bars are substantially flush, the ends of the tie bars may extend 1-2 μm from either the third sidewall 90 or the fourth sidewall 92. In other implementations, the tie bars 46 may extend more than or less than 1-2 μm from the sidewalls.

As illustrated by FIGS. 12 and 13, in various implementations the plurality of leads 42 may be exposed through the first surface 82 of the semiconductor package 78. Similarly, the first die flag 64 and the second die flag 66 may also be exposed through the first surface 82 of the semiconductor package 78. In various implementations the plurality of leads and/or the first and second die flag may lie flush with the mold compound of the first surface 82 of the semiconductor package. In other implementations, the plurality of leads, the first die flag, and/or the second die flag may protrude from the mold compound of the first surface 82 of the semiconductor package. In various implementations, the first die flag tie bar 68 and the second die flag tie bar 70 may also be exposed on the third sidewall 90 and fourth sidewall 92 of the semiconductor package 78. In various implementations, the die flag leads 72 may extend from the second sidewall 88 of the semiconductor package 78. The first die flag tie bar 68, the second die flag tie bar 70, and or the die flag leads 72 may be exposed through the first surface 82 of the semiconductor package 78. As illustrated, the mold compound 76 at least partially encapsulates the plurality of leads 42, the plurality of tie bars 46, the first die flag 64, and the second die flag 66.

Referring to FIG. 16, a bottom view of a second implementation of a semiconductor package is illustrated. The semiconductor package 96 includes a lead frame 98. In various implementations, the lead frame 98 may include one or more die flags 100, leads 102, and one or more tie bars 104. The semiconductor package may be a dual the die flat lead package. In other implementations, the semiconductor package may be a type of package different from a dual die flat lead package.

Referring to FIG. 17, a top view of a plurality of the lead frames coupled to an outer frame is illustrated. The lead frames illustrated in FIG. 17 may be the same as or similar to the lead frame of the semiconductor package of FIG. 16. As indicated by the dashed lead perimeter lines 106 of FIG. 17, in various implementations an outer frame 108 may be coupled to a plurality of lead frames 110. While FIG. 17 illustrates the outer frame as having four lead frames, the outer frame 108 may be coupled to more than four lead frames. In particular implementations the outer frame may be coupled to 448 lead frames.

In other implementations, the outer frame 108 may be directly coupled to more than or less than four lead frames.

Referring to FIG. 18, a cross-sectional side view of a lead frame of FIG. 17 is illustrated. The cross-sectional view of FIG. 18 is taken across line 18-18 of FIG. 17. As illustrated by FIGS. 17 and 18, each lead frame includes one or more die flags 112. In various implementations, each lead frame includes a lead 114. In various implementations, the lead frame may include a tie bar 116 directly coupled to the lead 114. As illustrated by FIG. 18, the tie bar 116 may be half-etched.

Figure 20:
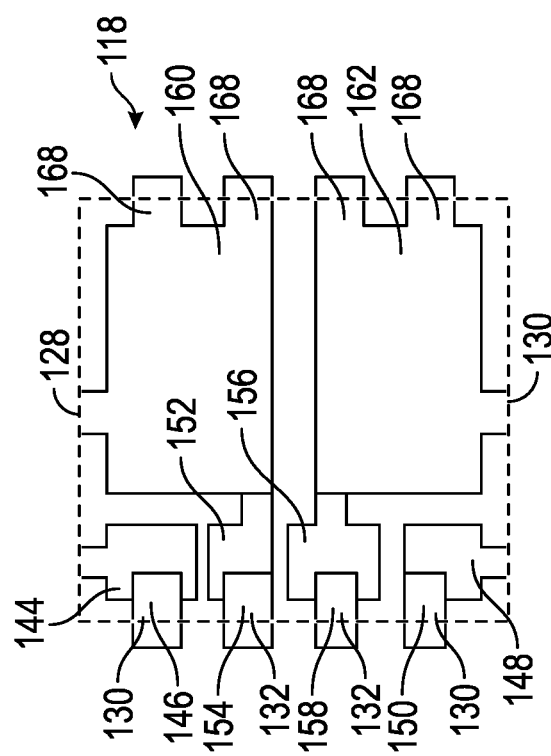
FIG. 20 is an illustration of a bottom view of the lead frame of FIG. 19.
Figure 22:
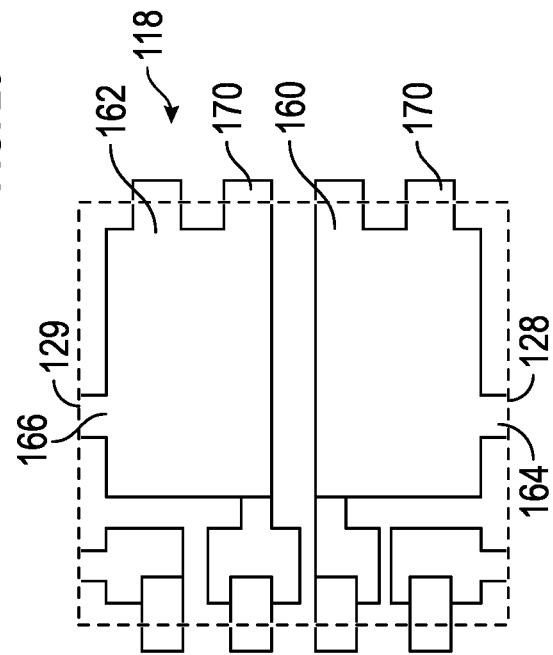
FIG. 22 is an illustration of a top view of the lead frame of FIG. 19.
Figure 19:
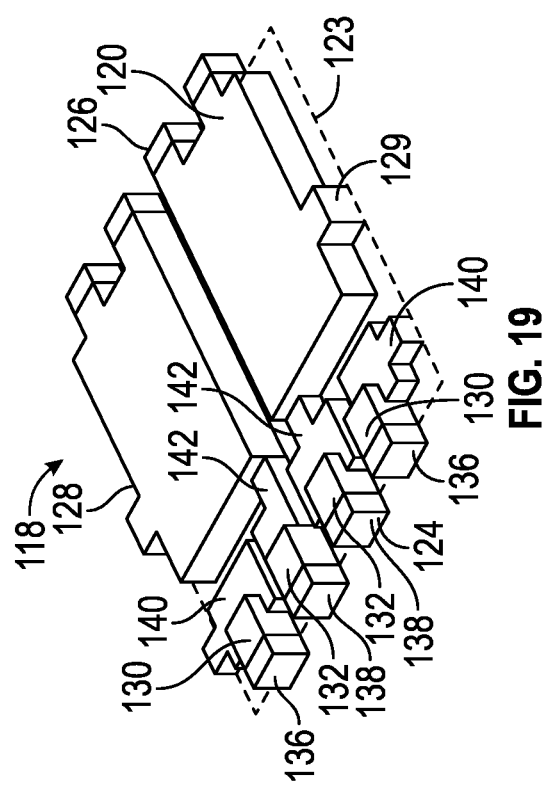
FIG. 19 is an illustration of a bottom perspective view of an implementation of a lead frame.
Figure 21:
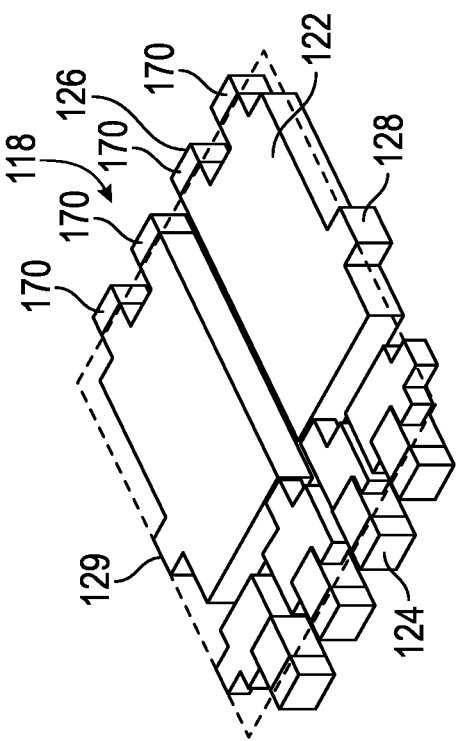
FIG. 21 is an illustration of a top perspective view of the lead frame of FIG. 19.

Referring to FIG. 19, a bottom perspective view of an implementation of a lead frame is illustrated. Referring to FIG. 20, a bottom view of the lead frame of FIG. 19 is illustrated. Referring to FIG. 21, a top perspective view of the lead frame of FIG. 19 is illustrated. Referring to FIG. 22, a top view of the lead frame of FIG. 19 is illustrated. The lead frame 118 of FIGS. 19-34 may be the same as or similar to the lead frames illustrated in any of FIGS. 16-18. The lead frame 118 includes a first surface 120 (which may be considered a bottom surface) and a second surface 122 opposite the first surface. The lead frame 118 may be made from any material disclosed herein.

As illustrated by FIGS. 19-34, the dashed perimeter line 123 is included to illustrate the plane that the second surface 122 lies in as well as showing the perimeter of the lead frame encompassed within the mold compound. As illustrated by FIGS. 19-22, the lead frame includes a first side 124, a second side 126, a third side 128, and a fourth side 129. In various implementations, the first side 124 of the lead frame includes a first plurality of leads 130 and a second plurality of leads 132. In various implementations, the plurality of leads of FIGS. 4-7 may be similar to the first plurality of leads 130 and the second plurality of leads 132 of FIGS. 19 through 22 with the primary difference being the particular tie bars that the leads of FIGS. 19 through 22 are directly coupled to. In various implementations, the first plurality of leads 130 may include two leads. Similarly, in various implementations, the second plurality of leads 132 may also include two leads. In other implementations, either the first and/or the second plurality of leads may include more than or less than two leads. In various supplementations, each lead of the first plurality of leads may include an electroplated end 136 and each lead of the second plurality of leads may include an electroplated end 138. The electroplated ends may be the same as or similar to any other electroplated end disclosed herein.

Still referring to FIGS. 19-22, the lead frame 118 includes a first plurality of half-etched tie bars 140 and a second plurality of half-etched tie bars 142. As illustrated, the first plurality of half-etched tie bars are directly coupled to the first plurality of leads and the second plurality of half-etched tie bars 142 are directly coupled to the second plurality of leads 132. In various implantations, the number of tie bars within the first and/or second plurality of tie bars may be the same as the number of leads within the first and/or second plurality of leads. In other implementations, the first and/or second plurality of tie bars may include more or fewer tie bars than there are leads within the first and/or second plurality of leads on the first side of the lead frame. In particular implementations, and as illustrated by FIG. 20, the lead frame 118 may include a first tie bar 144 directly coupled to a first lead 146, a second tie bar 148 directly coupled to a second lead 150, a third tie bar 152 directly coupled to a third lead 154, and a fourth tie bar 156 directly coupled to a fourth lead 158. As illustrated by FIGS. 19 and 21, the half-etch of the tie bars may be considered a bottom half-etch inasmuch as the bottom surface (or the surface facing the bottom of the semiconductor package) of the tie bars are etched. In various implementations, the first tie bar 144 may be used to electroplate an end of the first lead 146, the second tie bar 148 may be used to electroplate an end of the second lead 150, the third tie bar 152 may be used to electroplate an end of the third lead 154, and the fourth tie bar 156 may be used to electroplate an end of the fourth lead 158.

Referring to FIG. 20, in various implementations the first tie bar 144 may be positioned between the first lead 146 and a first die flag 160. The third tie bar 152 may be directly coupled between and electrically couple the third lead 154 to the first die flag 160. Likewise, the second tie bar 148 may be positioned between the second lead 150 and a second die flag 162. The fourth tie bar 156 may also be directly coupled between and electrically couple the fourth lead 158 to the second die flag 162.

Still referring to FIGS. 19-22, the lead frame may include a first die flag 160 and a second die flag 162. In other implementations, the lead frame may include only a single die flag or may include more than two die flags. Any of the die flags of the lead frame 118 may also serve as a heat sink. As illustrated clearly in FIGS. 20 and 22, in various implementations the die flags may be electrically isolated from the first plurality of tie bars 140, and in turn, may be electrically isolated from the first plurality of leads 130.

In various implementations, the first die flag 160 may include a first die flag tie bar 164. Similarly, in various implementations, the second die flag 162 may include a second die flag tie bar 166. The die flag tie bars may be on the same side of the lead frame as the first and second plurality of tie bars.

In various implementations, the first die flag 160 and the second die flag 162 may include one or more die flag leads 168 directly coupled to the first die flag 160 and or the second die flag 162. The die flag leads may be on the second side 126 of the lead frame 118 opposite the first side 124 of the lead frame. In various implementations, each of the die flag leads 168 may include an electroplated end 170. The electroplated end 170 may include any type of material disclosed herein.

Figure 23:
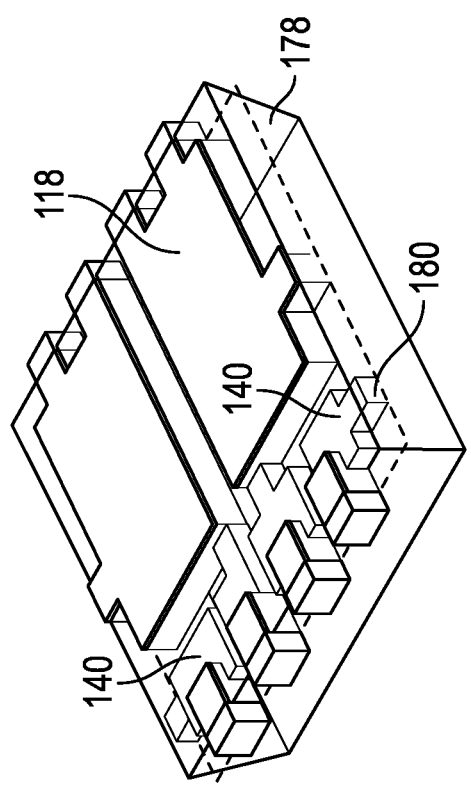
FIG. 23 is an illustration of a bottom perspective view of the lead frame of FIG. 19 encapsulated by a mold compound illustrated as transparent.
Figure 24:
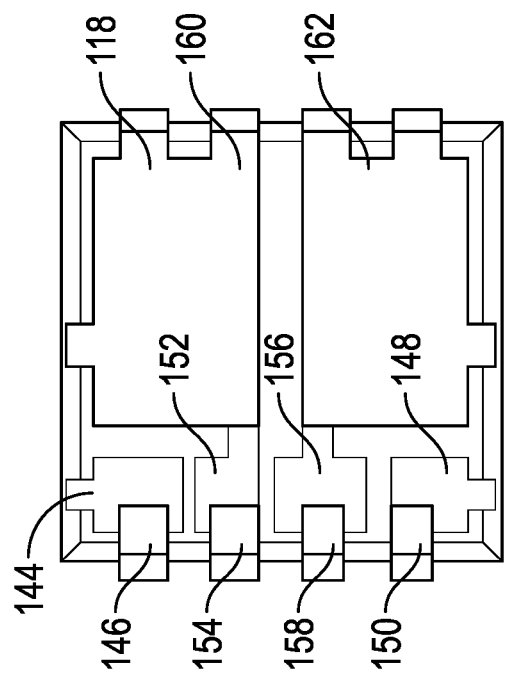
FIG. 24 is an illustration of a bottom view of the lead frame and mold compound of FIG. 23.
Figure 25:
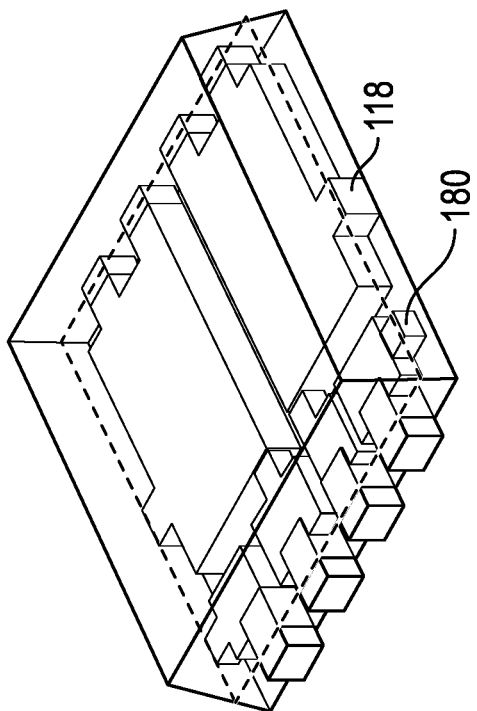
FIG. 25 is an illustration of a top perspective view of the lead frame and mold compound of FIG. 23.
Figure 26:
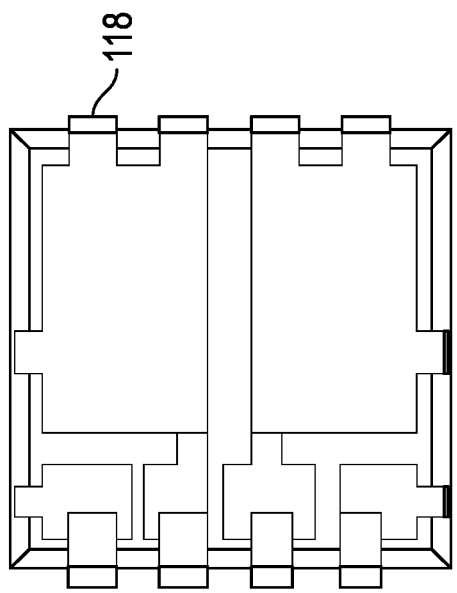
FIG. 26 is an illustration of a top view of the lead frame and mold compound of FIG. 23.

Referring to FIGS. 23 through 26, implementations of the lead frame of FIGS. 19 through 22 encapsulated by a mold compound are illustrated. The mold compound 178 is illustrated as transparent in order to fully understand the relation between the mold compound and the lead frame 118. More specifically, referring to FIG. 23, a bottom perspective view of the lead frame of FIG. 19 encapsulated by a mold compound is illustrated. Referring to FIG. 24, a bottom view of the lead frame and mold compound of FIG. 23 is illustrated. Referring to FIG. 25, a top perspective view of the lead frame and mold compound of FIG. 23 is illustrated. Referring to FIG. 26, a top view of the lead frame and mold compound of FIG. 23 is illustrated.

As illustrated by at least FIGS. 23 and 25, each of the first plurality of tie bars 140 are entirely encapsulated within the mold compound 178 except for a single end 180 of each tie bar of the first plurality of tie bars 140. In various implementations, and as clearly illustrated by FIGS. 24 and 26, mold compound 178 may electrically isolate the first tie bar 144 from the first die flag 160 and the second tie bar 148 from the second die flag 162. In turn, the first die flag 160 and the second die flag 162 may be electrically isolated from the first plurality of leads 130. As illustrated by FIGS. 24-26, the third tie bar may be directly coupled to both the third lead 154 and the first die flag 160 and the fourth tie bar may be directly coupled to both the fourth lead 158 and the second die flag 162.

Figure 28:
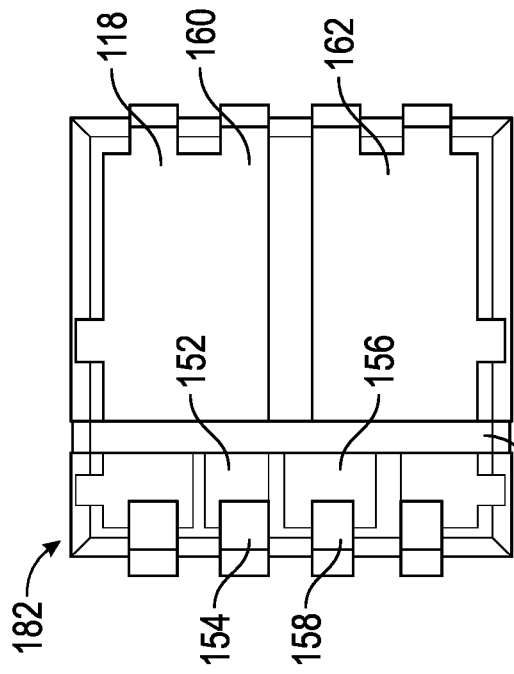
FIG. 28 is an illustration of a bottom view of the lead frame and mold compound of FIG. 27.
Figure 30:
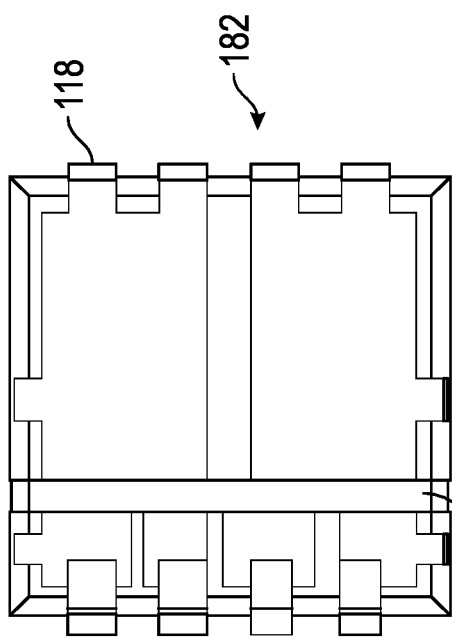
FIG. 30 is an illustration of a top view of the lead frame and mold compound of FIG. 27.
Figure 27:
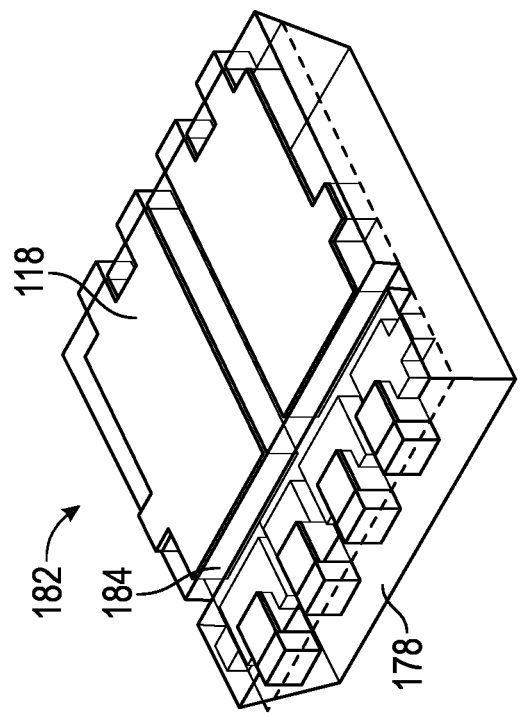
FIG. 27 is an illustration of a bottom perspective view of the lead frame and mold compound of FIG. 23 having a trench formed therein.
Figure 29:
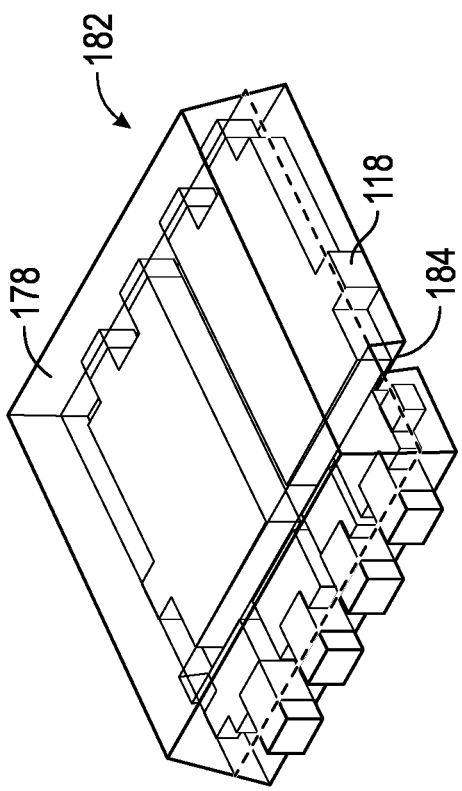
FIG. 29 is an illustration of a top perspective view of the lead frame and mold compound of FIG. 27.

Referring to FIGS. 27-30, the lead frame and mold compound of FIGS. 23-26 are illustrated with a trench formed therein. More specifically, referring to FIG. 27, a bottom perspective view of the lead frame and mold compound of FIG. 23 having a trench formed therein is illustrated. Referring to FIG. 28, a bottom view of the lead frame and mold compound of FIG. 27 is illustrated. Referring to FIG. 29, a top perspective view of the lead frame and mold compound of FIG. 27 is illustrated. Referring to FIG. 30, a top view of the lead frame and mold compound of FIG. 27 is illustrated. As illustrated by FIGS. 27 through 30, in various implementations the semiconductor package 182 may include a trench 184. The mold compound of FIGS. 27-30 is illustrated as transparent in order to more clearly show the relationship between the mold compound 178 and the lead frame 118.

Figure 32:
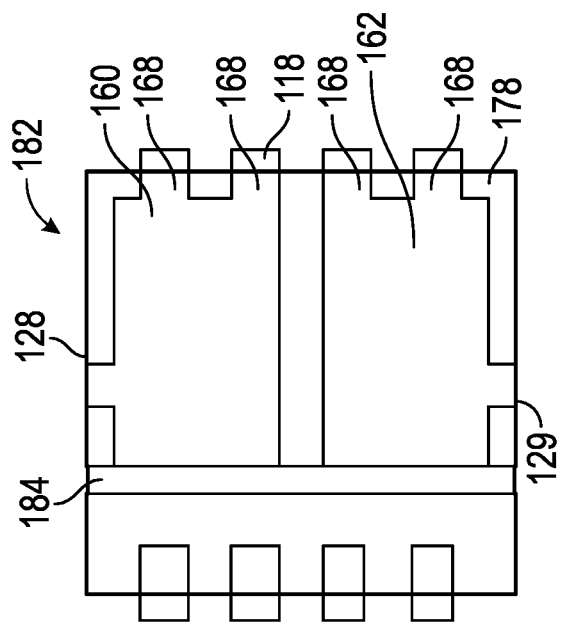
FIG. 32 is an illustration of a bottom view of the semiconductor package of FIG. 31.
Figure 34:
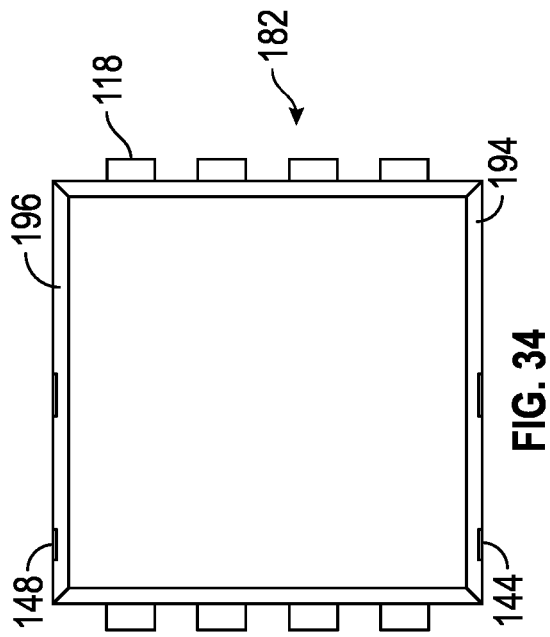
FIG. 34 is an illustration of a top view of the semiconductor package of FIG. 31.
Figure 31:
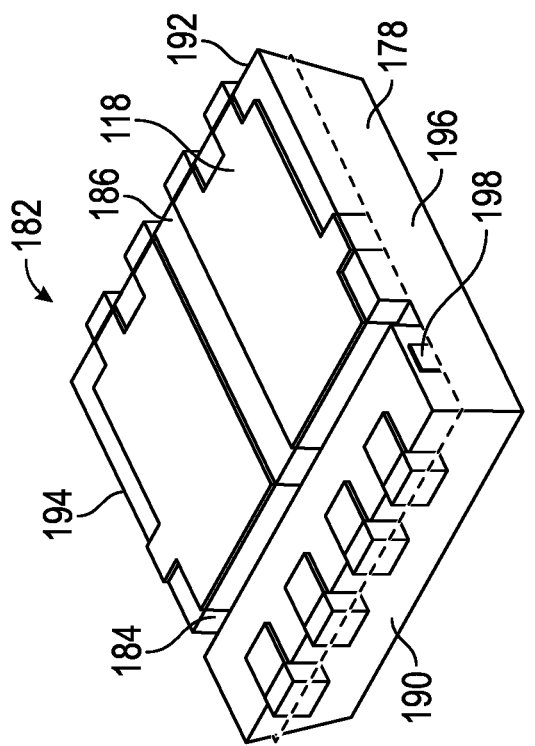
FIG. 31 is an illustration of a bottom perspective view of a semiconductor package.
Figure 33:
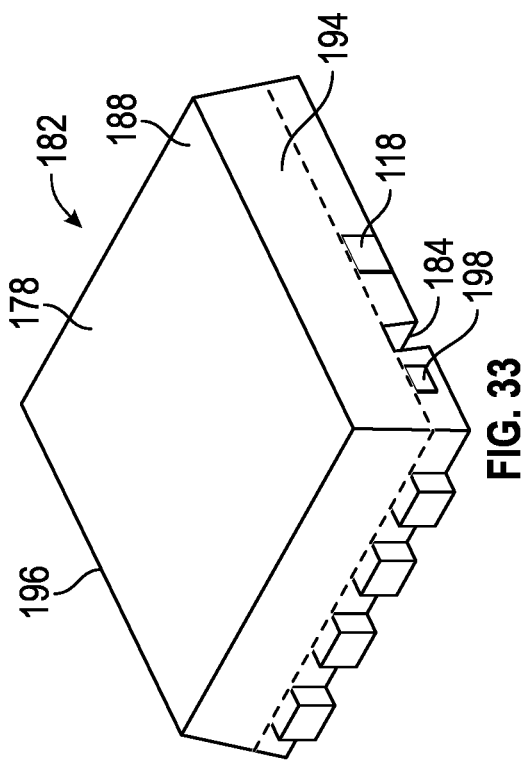
FIG. 33 is an illustration of a top perspective view of the semiconductor package of FIG. 31.

Referring to FIGS. 31-34, views of the semiconductor package 182 are illustrated. More specifically, referring to FIG. 31, a bottom perspective view of the semiconductor package is illustrated. Referring to FIG. 32, a bottom view of the semiconductor package of FIG. 31 is illustrated. Referring to FIG. 33, a top perspective view of the semiconductor package of FIG. 31 is illustrated. Referring to FIG. 34, a top view of the semiconductor package of FIG. 31 is illustrated. As illustrated by FIGS. 31-34, the semiconductor package includes a first surface 186 opposite a second surface 188. In various implementations, the first surface 186 of the semiconductor package 182 corresponds to the first surface of the lead frame 118 and the second surface 188 of the semiconductor package corresponds to the second surface of the lead frame. Further, as illustrated by FIGS. 31-34, the semiconductor package 182 includes a first sidewall 190, a second sidewall 192 opposite the first sidewall, a third sidewall 194, and a fourth sidewall 196 opposite the third sidewall. The third sidewall 194 and the fourth sidewall 196 are coupled between the first sidewall 190 and the second sidewall 192. Each of the sidewalls are also coupled between the first surface 186 the second surface 188. In various implementations, and as illustrated by FIGS. 31 through 34, any or all the first sidewall 190, the second sidewall 192, the third sidewall 194, and/or the fourth sidewall 196 may be sloped. In other implementations, any or all of the first sidewall 190, the second sidewall 192, the third sidewall 194, and/or the fourth sidewall 196 may be perpendicular to both the first surface 186 and the second surface 188 of the semiconductor package 182.

As illustrated by FIGS. 27 through 32, the trench 184 may extend from the third sidewall 194 of the semiconductor package 182 to the fourth sidewall 196 of the semiconductor package. Further, as illustrated by FIGS. 27-33, the depth of the trench 184 may be at least as deep as the surface of the tie bars that is coextensive with the second surface of the lead frame. In other implementations, the depth of the trench 184 may extend deeper than the surface of the tie bars coextensive with the second surface of the lead frame. As illustrated by FIGS. 28 and 30, the trench 184 may be between the first plurality of tie bars and the die flags as well as between the second plurality of tie bars and the die flags. In turn, the trench 184 may separate the first plurality of leads and the second plurality of leads from the first die flag and the second die flag. In such implementations, the addition of the trench 184 may electrically isolate the third tie bar 152, and in turn the third lead 154, from the first die flag 160 and the fourth tie bar 156, and in turn the fourth lead 158, from the second die flag 162.

In various implementations, an end of the third half-etched tie bar 152 and an end of the fourth half-etched tie bar 156 may be exposed on a sidewall of the trench 184. In implementations where the width of the trench 184 is at least as wide as the width of the mold compound that separates the first plurality of tie bars from the first die flag and the second die flag, a portion of the first tie bar 144 and/or a portion of the second tie bar 148 may also be exposed on a sidewall of the trench 184.

In various implementations, the first plurality of leads and second plurality of leads may extend from the first sidewall 190 of the semiconductor package 182. In various implementations, the electroplated ends of the leads may be the portion of the leads that extend from the first sidewall 190. In particular implementations, each lead, which may include the electroplated end, may extend from the first sidewall 190 eight μm. In other implementations, each lead of the first and second plurality of leads may extend from the first sidewall of the semiconductor package more than or less than eight μm.

Referring to FIGS. 31 and 33, an end 198 of each of the first plurality of tie bars 140 is exposed on either the third sidewall 90 or the fourth sidewall 92 of the semiconductor package 78. More particularly, and as also illustrated by FIG. 34, in various implementations an end of the first tie bar 144 may be exposed on the third sidewall 194 and an end of the second tie bar 148 may be exposed on the fourth sidewall 196.

In various implementations, the ends of the tie bars 140 may be flush or substantially flush with the third sidewall 194 and or the fourth sidewall 196. In implementations where the ends of the tie bars are substantially flush, the ends of the tie bars may extend 1-2 μm from either the third sidewall 194 or the fourth sidewall 196. In other implementations, the tie bars 140 may extend more than or less than 1-2 μm from the sidewalls.

As illustrated by FIGS. 31 and 32, in various implementations the first plurality of leads 130 and second plurality of leads 132 may be exposed through the first surface 186 of the semiconductor package 182. Similarly, the first die flag 160 and the second die flag 162 may also be exposed through the first surface 186 of the semiconductor package 182. In various implementations the plurality of leads and/or the first and second die flag may lie flush with the mold compound of the first surface 186 of the semiconductor package. In other implementations, the plurality of leads, the first die flag, and/or the second die flag may protrude from the mold compound of the first surface 186 of the semiconductor package. In various supplementations, the first die flag tie bar 164 and the second die flag tie bar 166 may also be exposed on the third sidewall 194 and fourth sidewall 196 of the semiconductor package 182. In various implementations, the die flag leads 168 may extend from the second sidewall 192 of the semiconductor package 182. The first die flag tie bar 164, the second die flag tie bar 166, and/or the die flag leads 168 may be exposed through the first surface 186 of the semiconductor package 182. As illustrated, the mold compound 178 at least partially encapsulates the first plurality of leads 130, the second plurality of leads 132, the first plurality of tie bars 140, the second plurality of tie bars 142, the first die flag 160, and the second die flag 162.

Figure 39:
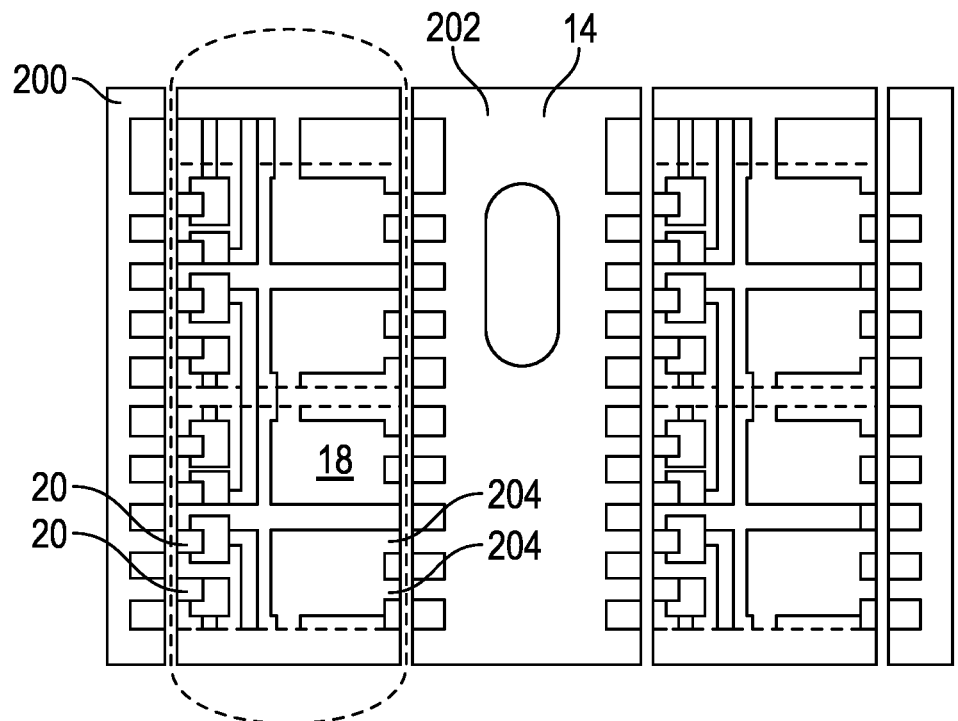
FIG. 39 is an illustration of the plurality of the lead frames of FIG. 2 having a plurality of cuts formed therein.
Figure 40:
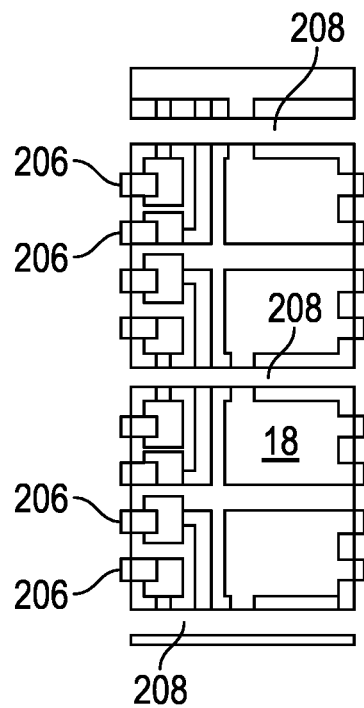
FIG. 40 is an illustration of a singulated semiconductor package.

Referring to FIGS. 2, 39, and 40, a method of forming a semiconductor package similar to FIGS. 12 through 15 is illustrated. More specifically, referring to FIG. 2, a top view of the plurality of the lead frames coupled to an outer frame is illustrated. Referring to FIG. 39, the plurality of the lead frames of FIG. 2 having a plurality of cuts formed therein is illustrated. Referring to FIG. 40, a singulated semiconductor package is illustrated.

Referring to FIG. 2, in various implementations of methods of forming a semiconductor package, the method may include providing a lead frame 16 encompassed by an outer frame 14. While FIG. 2 illustrates the outer frame 14 encompassing four separate lead frames, in other implementations the outer frame 14 may encompass more than four or less than four separate lead frames. In various implementations, the lead frame 16 may be the same as or similar to the lead frames of FIGS. 4-15.

In various implementations the method of forming the semiconductor package includes half-etching the plurality of tie bars 22. The tie bars may be half-etched to be the same as or similar to any other half-etched tie bar disclosed herein. As illustrated, the plurality of tie bars 22 are directly coupled to the plurality of leads 20. In various supplementations, the method includes at least partially encapsulating the lead frame in a mold compound. The mold compound may be the same as or similar to any mold compound disclosed herein and may encapsulate particular portions of the lead frame 16 similar to any other mold compound encapsulating other elements of lead frames disclosed herein.

As illustrated by FIG. 2 the plurality of tie bars 22, and in turn the plurality of leads 20, are electrically isolated from the plurality of die flags 18 due to the mold compound between the tie bars 22 and the die flag 16.

Referring to FIG. 39, the plurality of the lead frames of FIG. 2 having a plurality of cuts formed therein is illustrated. In various implementations, the method of forming the semiconductor package includes removing a first side 200 of the outer frame 14 from the plurality of leads 20. In such implementations, an end of each of the plurality of leads may be exposed where the first side of the outer frame was removed. The first side of the outer frame 14 may be removed through a saw process, any other type of cutting process, a punch process, or any other type of removal process. As illustrated by FIG. 39, the method may include removing a second side 202 of the outer frame 14 from the lead frame 16. In such implementations, one or more die flag leads 204 may be exposed where the second side 202 of the outer frame 14 was removed. The second side of the outer frame 14 may be removed simultaneously with the first side of the outer frame or after the first side of the outer frame is removed. The second side 202 of the outer frame 14 may be removed using any removal process disclosed herein. This process may be repeated for any number of columns of the lead frames included in the outer frame. While FIG. 39 illustrates only two columns, in other implementations the outer frame 14 may include more than two columns or only a single column of the lead frames.

Referring to FIG. 40, a view of a simulated semiconductor package is illustrated. The portion of the lead frames in the dashed line of FIG. 39 are illustrated in FIG. 40. In various implementations, the method of forming the semiconductor package may include electroplating an end of each exposed lead 20. The ends of the leads 20 may be electroplated resulting from current applied to the leads 20 through the tie bars 22. In such implementations, the electroplating process may add a plurality of ends 206 to the plurality of leads 20. The electroplated ends 206 may be the same as or similar to any other electroplated ends disclosed herein. In particular implementations, the electroplated ends may extend at least eight µm from a side of the semiconductor package. In other implementations, the electroplated ends may extend less than eight µm from a side of the semiconductor package.

Still referring to FIG. 40, in various implementations the method of forming the semiconductor package includes singulating the lead frame from the outer frame 14 through removal of a third side of the outer frame and a fourth side of the outer frame opposite the third side. In such implementations, removal of the third and fourth side of the outer frame may expose an end of each tie bar of the plurality of tie bars. In various implementations, singulation of the lead frame may also include singulating the semiconductor package. Singulation of the semiconductor package may be done through forming a plurality of cuts 208. Cuts 208 may be formed using any method disclosed herein. In other implementations, the method does not include cutting a third side of fourth side of the outer frame from the lead frame but may include punching the lead frame from the remaining portions of the outer frame. In the implementation illustrated by FIGS. 2, 39, and 40, the plurality of half-etched tie bars 22 may remain in the final singulated semiconductor package. The tie bars 22 may remain in the final package inasmuch as they are half-etch and electrically isolated from the die flags. In such implementations, the strength of the package may be increased as there is no need to later remove the tie bars through mechanical or chemical processes in order to electrically isolate the tie bars from the die flags.

Figure 41:
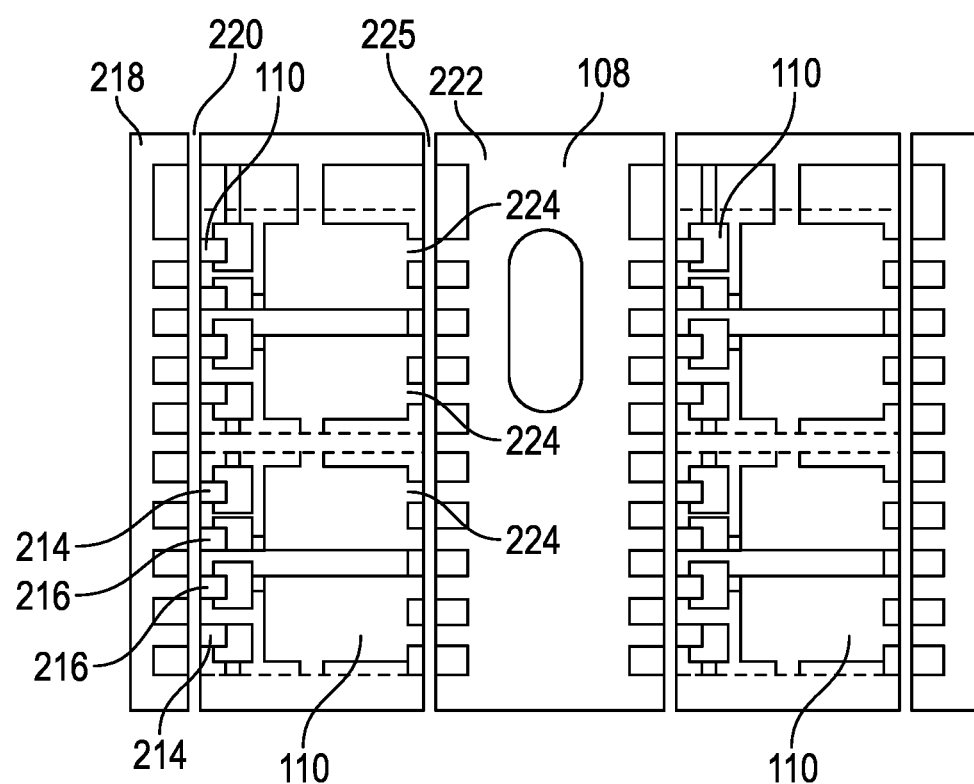
FIG. 41 is a an illustration of view of the plurality of the lead frames of FIG. 17 having a plurality of cuts formed therein.
Figure 42:
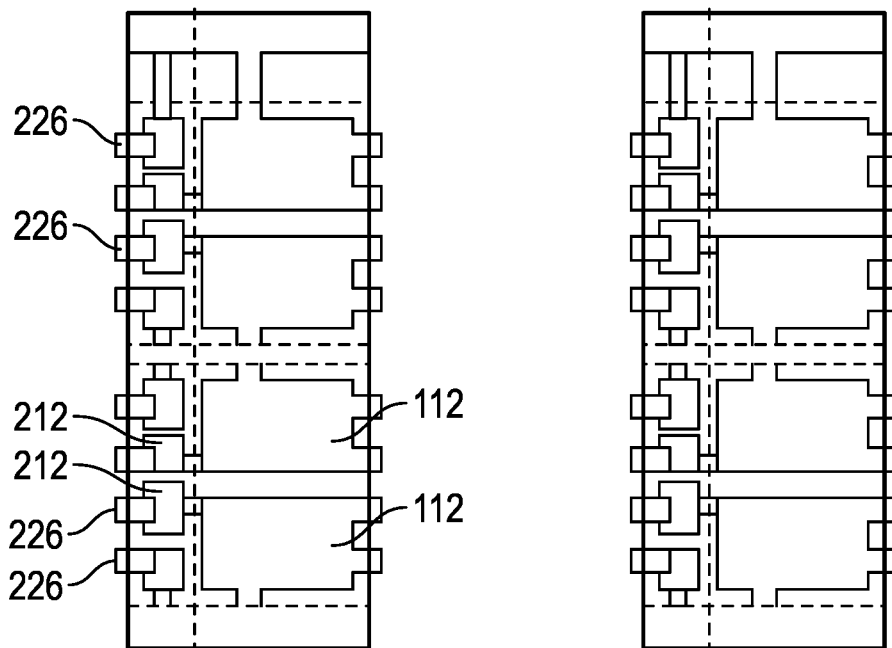
FIG. 42 is an illustration of a top view of a plurality of the lead frames with an indication of where a plurality of trenches may be formed.
Figure 43:
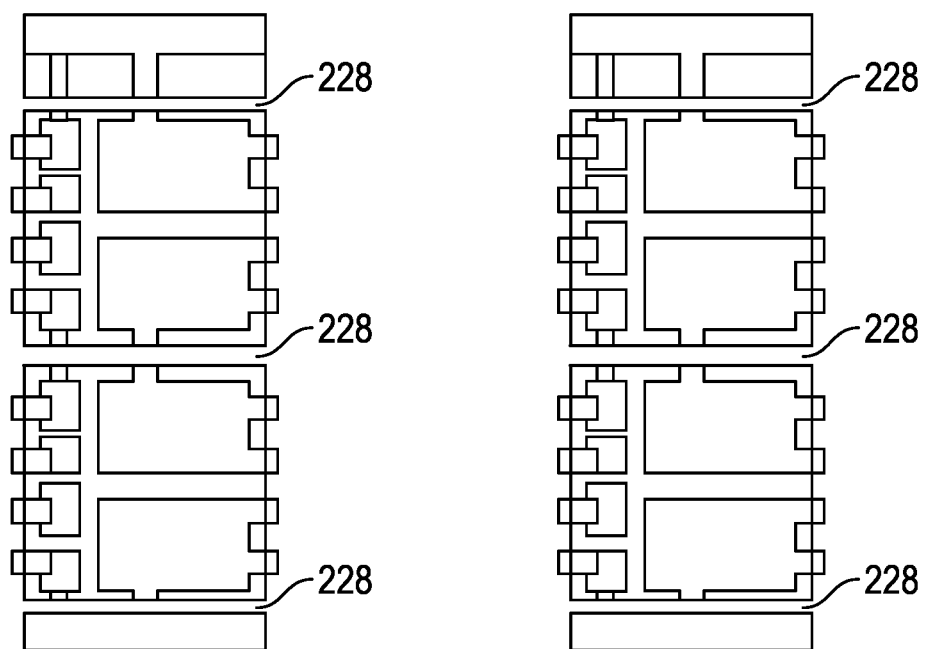
FIG. 43 is an illustration of a plurality of singulated semiconductor packages.

Referring to FIGS. 17 and 41-43, a method of forming a semiconductor package the same as or similar to FIGS. 31-34 is illustrated. More specifically, referring to FIG. 17, a top view of the plurality of the lead frames coupled to an outer frame is illustrated. Referring to FIG. 41 a view of the plurality of the lead frames of FIG. 17 having a plurality of cuts formed therein is illustrated. Referring to FIG. 42, a top view of a plurality of the lead frames with an indication of where a plurality of trenches may be formed is illustrated. Referring to FIG. 43, a plurality of singulated semiconductor packages are illustrated.

Referring to FIG. 17, in various implementations of methods of forming a semiconductor package may include providing a lead frame 110 encompassed by an outer frame 108. While FIG. 17 illustrates the outer frame 108 encompassing four separate lead frames, in other implementations the outer frame 108 may encompass more than or less than four separate lead frames. The lead frame 110 may be the same as or similar to the lead frames of FIGS. 19-34.

In various implementations the method of forming the semiconductor package includes half-etching a first plurality of tie bars 210 and a second plurality of tie bars 212. As illustrated, the first plurality of tie bars 210 are directly coupled to a first plurality of leads 214 and the second plurality of tie bars 212 are directly coupled to a second plurality of leads 216. In various supplementations, the method includes at least partially encapsulating the lead frame in a mold compound. The mold compound may be the same as or similar to any mold compound disclosed herein and may encapsulate particular portions of the lead frame 110 similar to any other mold compound encapsulating other elements of lead frames disclosed herein.

As illustrated by FIG. 17, the first plurality of tie bars 210, and in turn the first plurality of leads 214, are electrically isolated from the plurality of die flags 112 due to the mold compound between the tie bars 210 and the die flags 112. In various implementations, the second plurality of tie bars 212 may be directly coupled to both the second plurality of leads 216 and the plurality of die flags 112.

Referring to FIG. 41, the plurality of the lead frames of FIG. 17 having a plurality of cuts formed therein is illustrated. In various implementations, the method of forming the semiconductor package includes removing a first side 218 of the outer frame 108 from the first plurality of leads 214 and the second plurality of leads 216. In such implementations, an end of each of the first and second plurality of leads may be exposed where the first side of the outer frame was removed. The first side of the outer frame 108 may be removed through a saw process, any other type of cutting process, a punch process or any other type of removal process. As illustrated by FIG. 41, the first side 218 of the outer frame 108 was removed through the formation of a first cut 220. As illustrated by FIG. 41, the method may include removing a second side 222 of the outer frame 108 from the lead frame 110. In such implementations, one or more die flag leads 224 may be exposed where the second side 222 of the outer frame 108 was removed. The second side of the outer frame 108 may be removed simultaneously with the first side of the outer frame or after the first side of the outer frame was removed. The second side 202 of the outer frame 108 may be removed using any removal process disclosed herein. As illustrated by FIG. 41, cut 225 is illustrated to show the removal of the second side 222 of the outer frame 108 from the lead frame 110. This process may be repeated for any number of columns of the lead frames included in the outer frame. While FIG. 41 illustrates only two columns, in other implementations the outer frame 108 may include more than two columns or only a single column of the lead frames.

Referring to FIG. 42, a top view of the plurality of the lead frames with an indication of where a plurality of trenches may be formed is illustrated. In various implementations, the method of forming the semiconductor package may include electroplating an end of each exposed lead of the first plurality of leads 214 and second plurality of leads 216. The ends of the leads may be electroplated resulting from current applied to the leads through the first plurality of tie bars 210 and second plurality of tie bars 212. In such implementations, the electroplating process may add a plurality of ends 226 to the first plurality of leads 214 and second plurality of leads 216. The electroplated ends 226 may be the same as or similar to any other electroplated end disclosed herein. In particular implementations, the electroplated ends may extend eight μm from a side of the semiconductor package. In other implementations, the electroplated ends may extend more than or less than eight μm from a side of the semiconductor package.

As illustrated by FIG. 42, the method may include forming a trench through a length of one or more lead frames and between the second plurality of tie bars 212 and a plurality of die flags 112. The trench may be the same as any other trench disclosed here in. The trench may be formed through a cutting process or any other removal process disclosed herein. In implementations including the formation of a trench, the formation of trench may electrically isolate the plurality of die flags 112 from the second plurality of leads 216.

Referring to FIG. 43, a view of a simulated semiconductor package is illustrated. In various implementations, the method of forming the semiconductor package includes singulating the lead frame from the outer frame 108 through removal of a third side of the outer frame and a fourth side of the outer frame opposite the third side. In such implementations, removal of the third and fourth side of the outer frame may expose an end of each tie bar of the first plurality of tie bars 210. In various implementations, singulation of the lead frame may also result in singulation of the semiconductor package. Singulation of the semiconductor package may be done through forming a plurality of cuts 228. Cuts 228 may be formed using any method disclosed herein. In other implementations, the method does not include cutting a third side of fourth side of the outer frame from the lead frame but may include punching the lead frame from the remaining portions of the outer frame. In the implementation illustrated by FIGS. 17 and 41-43, the first plurality of half-etched tie bars 210 may remain in the final singulated semiconductor package. The first plurality of tie bars 210 may remain in the final package inasmuch as they are half-etched and electrically isolated from the die flags. In the implementation illustrated by FIGS. 17 and 41-43, a larger die flag or die flags may be used in the semiconductor package as compared to the die flags of FIGS. 12-15. The larger die flag may be a result of the second plurality of tie bars 212 directly coupled to the plurality of die flags 112. In such implementations, the semiconductor package need not accommodate for additional space between the second plurality of tie bars and the die flags inasmuch as a portion of the second plurality of tie bars are removed through the formation of the trench and the die flags are electrically isolated from the second plurality of leads through the formation of the trench.

Referring to FIG. 35, a bottom view of another implementation of the semiconductor package is illustrated. The semiconductor package 230 includes a lead frame 232. In various implementations, the lead frame 232 may include one or more die flags 234, and a plurality of leads 236. In particular implementations, including any implementation disclosed herein, the semiconductor package may be a dual die flat lead package. In other implementations, the semiconductor package may be a type of package different from a dual die flat lead package.

Referring to FIG. 36, a top view of a lead frame coupled to an outer frame is illustrated. The lead frame 238 illustrated in FIG. 36 may be the same as or similar to the lead frame of the semiconductor package of FIG. 35. While FIG. 36 illustrates only a single lead frame coupled to the outer frame 240, in various implementations the outer frame may be coupled to more than a single lead frame. In particular implementations the outer frame may be coupled to 448 lead frames.

Referring to FIG. 37, a first cross-sectional side view of a lead frame of FIG. 36 is illustrated and referring to FIG. 38, second cross-sectional side view of a lead frame of FIG. 36 is illustrated. The cross-sectional view of FIG. 37 is taken across line 37-37 of FIG. 36 and the cross-sectional view FIG. 38 is taken across line 38-38 of FIG. 36. As illustrated by FIGS. 36-38, each lead frame 238 includes one or more die flags 242. In particular implementations, the lead frame includes two die flags. In other implementations, the lead frame may include a single die flag or more than two die flags. In various implementations, and as illustrated by FIGS. 36-38, each lead frame includes a plurality of leads 244. In particular implementations, the plurality of leads 244 includes four leads. In other implementations, the plurality of leads 244 may include more than or less than four leads. In various implementations, one or more clips may be coupled to the lead frame and couple the plurality of leads to the one or more die flags 242. In particular implementations, a first clip 246 may couple a first lead 248 to a first die flag 250. A second clip 252 may couple a second lead 254 to the first die flag 250. A third clip 256 may couple a third lead 258 to a second die flag 260. A fourth clip 262 may couple a fourth lead 264 to the second die flag 260. In various implementations, the first clip 246 and the third clip 256 may be considered source clips inasmuch as they couple a source lead to a source pad of a semiconductor device coupled on the first die flag 250 and the second die flag 260. In such implementations, the second clip 252 and the fourth clip 262 may be considered gate clips as they couple a gate lead to a gate pad of a semiconductor device coupled on the first die flag 250 and the second die flag 260. In other limitations, any other arrangement of source clips, gate clips, or any other type of clip, may be used to couple a plurality of leads to a plurality of die flags. The clips may be used to electroplate an end of the first plurality of leads of lead frame.

Figure 44:
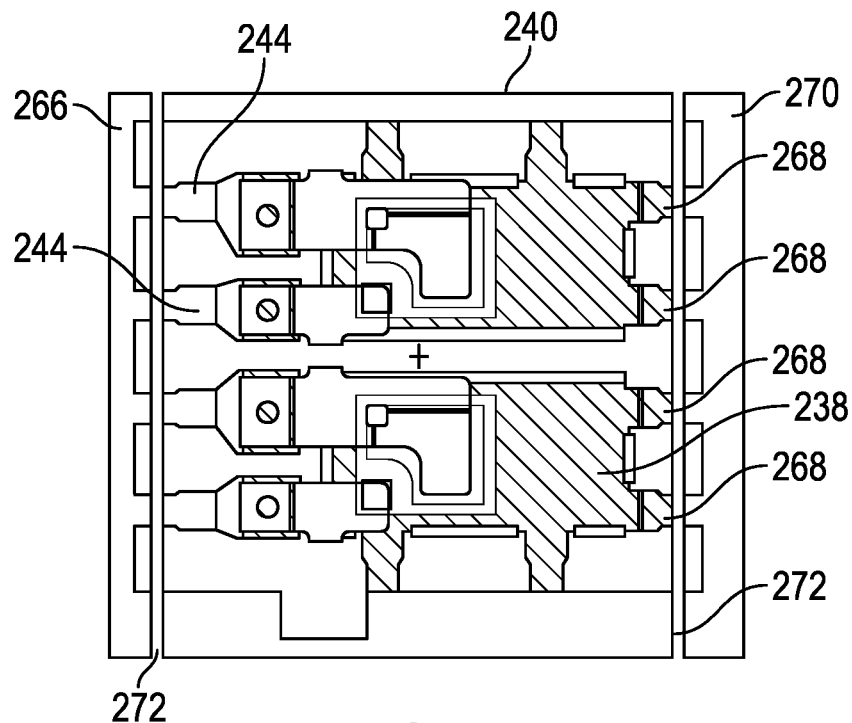
FIG. 44 is an illustration of a top view of the lead frame of FIG. 36 having a plurality of cuts formed therein.
Figure 45:
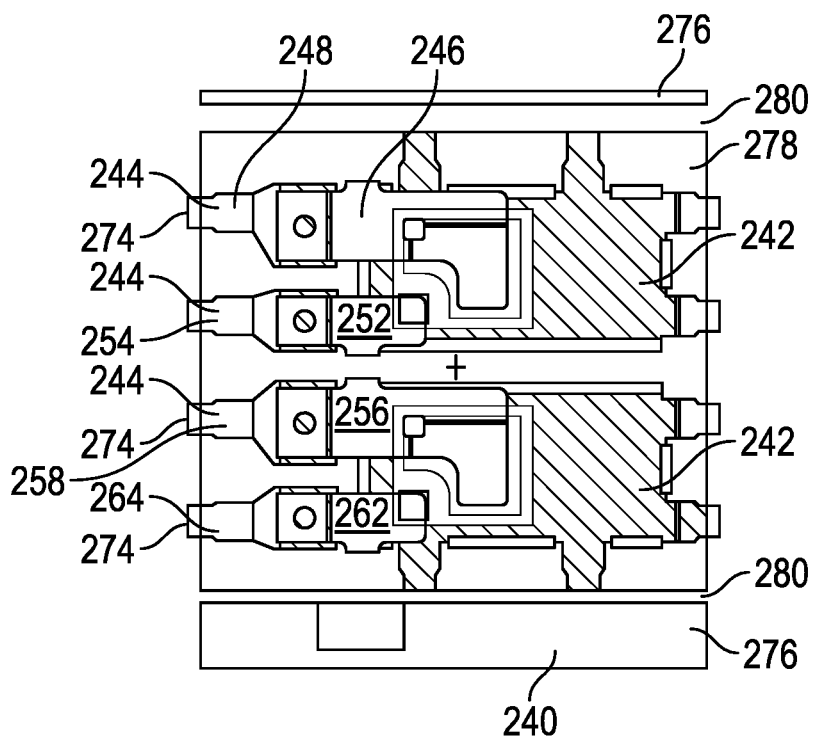
FIG. 45 is an illustration of a top view of a simulated semiconductor package.

Referring to FIGS. 36 and 44-45, a method of forming another implementation of a semiconductor package is illustrated. The method illustrated by FIGS. 36 and 44-45 may result in the formation of the semiconductor package the same as or similar to the semiconductor package of FIG. 35. In various implementations, the method may include providing a lead frame 238 encompassed by an outer frame 240. While FIG. 36 illustrates only a single lead frame encompassed by the outer frame 240, in other implementations the outer frame 240 may encompass more than a single lead frame. In various implementations, the method of forming the semiconductor package may include electrically coupling the plurality of leads 244 to the plurality of die flags 242 through a plurality of clips. In particular implementations, the method may include coupling a first lead 248 to the first die flag 250 through first clip 246, coupling a second lead 254 to the first die flag 250 through a second clip 252, coupling a third lead 258 to a second die flag 260 through a third clip 256, and coupling a fourth lead 264 to the second die flag 260 through the fourth clip 262.

In various implantations the method may include at least partially encapsulating the lead frame and the plurality of clips in a mold compound. In various implementations, a bottom surface of the plurality of die flags 242 as well as a bottom surface of the plurality of leads 244 may be exposed at a bottom of the semiconductor package.

Referring to FIG. 44, a top view of the lead frame of FIG. 36 having a plurality of cuts formed therein is illustrated. In various implementations, the method of forming the semiconductor package may include exposing an end of each lead of the plurality of leads 244 through removing a first side 266 of the outer frame 240. Similarly, the method may include exposing an end of a plurality of die flag leads 268 through removing a second side 270 of the outer frame 240. The first side and the second side may be removed through any removal process disclosed herein. As illustrated by FIG. 44, cuts 272 illustrate the removal of the first and second side of the outer frame 240 from the remainder of the lead frame 238.

Referring to FIG. 45, a top view of a singulated semiconductor package is illustrated. In various implementations, the method of forming the semiconductor package may include electroplating an end 274 of each of the plurality of leads 244 through the plurality of clips coupling the leads 244 to the plurality of die flags 242. More particularly, the method may include electroplating an end of the first lead 248 through a first clip 246, electroplating an end of the second lead 254 through the second clip 252, electroplating an end of the third lead 258 through a third clip 256, and/or electroplating an end of the fourth lead 264 through a fourth clip 262. In other implementations having more or fewer leads than what is illustrated by FIG. 45, the method may include electroplating the ends of those leads through a corresponding number of clips coupling the leads to a plurality of die flags 242. The electroplated ends 274 may be the same as or similar to any other electroplated end disclosed herein.

In various implementations, the method of forming the semiconductor package may include removing the remaining outer frame 276 and singulating the semiconductor package 278 from the outer frame 240. Removal of the remaining outer frame 276 may be removed through any removal process disclosed herein. As illustrated by FIG. 45, cuts 280 illustrate the removal of the remaining outer frame 276. In particular implementations, the first and second sides of the outer frame may be removed through a first punch and the remaining outer frame 276 may be removed through a second punch process.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method of forming a semiconductor package comprising:
   providing a lead frame encompassed by an outer frame, the lead frame comprising a plurality of leads, one or more die flags, and a plurality of tie bars directly coupled between the plurality of leads and the outer frame;
   half-etching the plurality of tie bars;
   at least partially encapsulating the lead frame in a mold compound;
   exposing an end of each lead of the plurality of leads through removing a first side of the outer frame from the lead frame;
   electroplating an end of each lead of the plurality of leads through the plurality of tie bars;
   singulating the lead frame from the outer frame.

2. The method of forming the semiconductor package of claim 1, wherein the plurality of tie bars comprise four tie bars.

3. The method of claim 1, wherein the plurality of tie bars comprise two tie bars.

4. The method of claim 1, further comprising half-etching a second plurality of tie bars directly coupled to and between a second plurality of leads and the one or more die flags.

5. The method of claim 4, further comprising exposing an end of each lead of the second plurality of leads through removing the first side of the outer frame.

6. The method of claim 4, further comprising electroplating the end of each lead of the second plurality of leads through the second plurality of tie bars.

7. The method of claim 6, further comprising electrically isolating the one or more die flags from the plurality of second leads by forming a trench through the second plurality of tie bars.

8. The method of claim 1, wherein the one or more die flags comprise a first die flag and a second die flag.

9. A method of forming a semiconductor package comprising:
- providing a lead frame encompassed by an outer frame, the lead frame comprising a plurality of leads, a plurality of die flags, and a plurality of tie bars directly coupled between the plurality of leads and the outer frame;
- half-etching the plurality of tie bars;
- at least partially encapsulating the lead frame in a mold compound;
- exposing an end of each lead of the plurality of leads through removing a first side of the outer frame from the lead frame;
- removing a second side of the outer frame from the lead frame;
- electroplating an end of each lead of the plurality of leads through the plurality of tie bars;
- singulating the lead frame from the outer frame through removal of a third side of the outer frame and an opposing fourth side of the outer frame;
- exposing an end of each tie bar of the plurality of tie bars through the removal of the third side and the fourth side of the outer frame.

10. The method of forming the semiconductor package of claim 9, wherein the plurality of tie bars comprise four tie bars.

11. The method of claim 9, wherein the plurality of tie bars comprise two tie bars.

12. The method of claim 9, further comprising half-etching a second plurality of tie bars directly coupled to and between a second plurality of leads and the plurality of die flags.

13. The method of claim 12, further comprising exposing an end of each lead of the second plurality of leads through removing the first side of the outer frame.

14. The method of claim 13, further comprising electroplating the end of each lead of the second plurality of leads through the second plurality of tie bars.

15. The method of claim 14, further comprising electrically isolating the plurality of die flags from the plurality of second leads by forming a trench through the second plurality of tie bars.

16. A method of forming a semiconductor package comprising:
- providing a lead frame comprising a plurality of leads and a plurality of die flags, wherein the lead frame is encompassed by an outer frame;
- electrically coupling the plurality of leads to the plurality of die flags through a plurality of clips;
- at least partially encapsulating the lead frame and the plurality of clips in a mold compound;
- exposing an end of each lead of the plurality of leads through removing a first side of the outer frame from the lead frame;
- electroplating the end of the each lead through the plurality of clips; and
- removing the remaining outer frame from the lead frame.

17. The method of forming the semiconductor package of claim 16, wherein the plurality of die flags include two die flags.

18. The method of forming the semiconductor package of claim 17, wherein the plurality of clips include two gate clips and two source clips.

19. The method of forming the semiconductor package of claim 16, wherein each end of each lead comprises a thickness of at least 8 micrometers of electroplated material coupled thereto.

20. The method of forming the semiconductor package of claim 16, wherein removing the first side of the outer frame is done through a first punch process and removing the remaining outer frame is done through a second punch process.

* * * * *